US008502269B2

(12) United States Patent
Sawahata et al.

(10) Patent No.: US 8,502,269 B2
(45) Date of Patent: Aug. 6, 2013

(54) SEMICONDUCTOR DEVICE

(75) Inventors: Kouichi Sawahata, Kanagawa (JP); Masaharu Sato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 148 days.

(21) Appl. No.: 13/198,434

(22) Filed: Aug. 4, 2011

(65) Prior Publication Data
US 2012/0032228 A1    Feb. 9, 2012

(30) Foreign Application Priority Data
Aug. 9, 2010   (JP) .................................. 2010-178930

(51) Int. Cl.
*H01L 23/62*   (2006.01)
(52) U.S. Cl.
USPC .... 257/173; 257/355; 257/358; 257/E29.218; 257/E29.219; 438/309; 438/312; 361/91.1; 361/91.5
(58) Field of Classification Search
USPC .......... 257/173, 355, 358, E29.218, E29.219; 438/309, 312; 361/91.1, 91.5
See application file for complete search history.

(56) References Cited

U.S. PATENT DOCUMENTS

| | | | | |
|---|---|---|---|---|
| 5,528,064 | A * | 6/1996 | Thiel et al. | 257/362 |
| 5,545,909 | A * | 8/1996 | Williams et al. | 257/355 |
| 6,399,990 | B1 * | 6/2002 | Brennan et al. | 257/355 |
| 6,864,538 | B2 * | 3/2005 | Mettler et al. | 257/361 |
| 7,566,914 | B2 | 7/2009 | Salcedo et al. | |
| 7,667,295 | B2 | 2/2010 | Fujii | |
| 7,787,226 | B2 * | 8/2010 | Sato | 361/56 |
| 2004/0127425 | A1 * | 7/2004 | Nudler et al. | 514/18 |

FOREIGN PATENT DOCUMENTS

JP    2009-004763 A    1/2009

OTHER PUBLICATIONS

Hiroki Fujii, et al., "A novel 80V-class HV-MOS platform technology featuring high-side capable 30V-gate-voltage drift-NMOSFET and a trigger controllable ESD protection BJT", IEEE International Symposium on Power Semiconductor Devices and Ics (ISPSD), 2009.
Nils Jensen, et al., "Coupled Bipolar Transistors as Very Robust ESD Protection Devices for Automotive Applications", EOS/ESD, 2003.

* cited by examiner

*Primary Examiner* — Kenneth Parker
*Assistant Examiner* — John Lin
(74) *Attorney, Agent, or Firm* — Sughrue Mion, PLLC

(57) ABSTRACT

A first first-conductivity-type diffusion layer, a first second-conductivity-type diffusion layer, a second first-conductivity-type diffusion layer, and a second second-conductivity-type diffusion layer are arranged in this order. In a region where the second second-conductivity-type diffusion layer and the first-conductivity-type layer are in contact with each other, impurity concentrations thereof are higher in a part in contact with a side face of the second second-conductivity-type diffusion layer than in a part at a bottom surface of the second second-conductivity-type diffusion layer.

9 Claims, 26 Drawing Sheets

SEMICONDUCTOR DEVICE

CROSS-REFERENCE TO RELATED APPLICATIONS

The disclosure of Japanese Patent Application No. 2010-178930 filed on Aug. 9, 2010 including the specifications, drawings and abstract is incorporated herein by reference in its entirety.

BACKGROUND

The present invention relates to a semiconductor device including a protection device that protects an internal circuit from an abnormal voltage such as that caused by electrostatic discharge.

A semiconductor device generally includes a protection device to protect an internal circuit from an abnormal voltage such as that caused by electrostatic discharge. An example of a protection device is that using a bipolar transistor as disclosed, for example, in Japanese Unexamined Patent Application Publication No. 2009-4763 or Fujii et al., "A novel 80V-class HV-MOS platform technology featuring high-side capable 30V-gate-voltage drift-NMOSFET and a trigger controllable ESD protection BJT," 2009 IEEE. Another example is that using a thyristor as disclosed, for example, in U.S. Pat. No. 7,566,914 or N. Jensen et al, "Coupled Bipolar Transistors as very robust ESD Protection Devices for Automotive Applications," EOS/ESD 2003.

More specifically, in the technique disclosed in Japanese Unexamined Patent Application Publication No. 2009-4763, a second base region with a low impurity concentration is formed at a side of a first base region of a bipolar transistor such that the second base region is shallower than the first base region is.

In the technique disclosed in Fujii et al., "A novel 80V-class HV-MOS platform technology featuring high-side capable 30V-gate-voltage drift-NMOSFET and a trigger controllable ESD protection BJT," 2009 IEEE, a triggering voltage of an npn bipolar transistor functioning as a protection device is controlled by adjusting the distance between a collector and a base of the npn bipolar transistor.

In the technique disclosed in U.S. Pat. No. 7,566,914, two thyristors having different breakdown voltages and different holding voltages are formed on the same substrate and they are wired such that these two thyristors can discharge abnormal voltages in different directions.

In the technique disclosed in N. Jensen et al, "Coupled Bipolar Transistors as very robust ESD Protection Devices for Automotive Applications," EOS/ESD 2003., a P$^+$ layer is additionally formed at a side of an N$^+$ layer on the upper side of a vertical-type npn bipolar transistor in a thyristor. A lateral-type pnp bipolar transistor is formed by this additional P$^+$ layer and a base (P layer) of the npn bipolar transistor.

SUMMARY

In some semiconductor devices, the protection device needs to provide a high HBM (Human Body Model) withstanding voltage. A thyristor may be preferably used as the protection device to achieve a high HBM withstanding voltage.

Some semiconductor devices include multiple protection devices having different triggering voltages. For use in such semiconductor devices, it is desirable to design protection devices such that the triggering voltage can be easily changed.

However, N. Jensen et al, "Coupled Bipolar Transistors as very robust ESD Protection Devices for Automotive Applications," EOS/ESD 2003 does not disclose any technique to adjust the triggering voltage. Although U.S. Pat. No. 7,566,914 discloses a technique to adjust the triggering voltage, the disclosed technique is to adjust the triggering voltage by changing the impurity concentration or the depth of an impurity region, and thus there is a possibility that this technique changes not only the triggering voltage but also the holding voltage.

In the techniques cited above, as described above, it is difficult to change the triggering voltage of the thyristor used as the protection device independently of the holding voltage.

According to an aspect of the present invention, a semiconductor device includes a first-conductivity-type layer, a first-conductivity-type buried layer whose upper surface is in contact with the first-conductivity-type layer and whose impurity concentration is higher than the impurity concentration of the first-conductivity-type layer, a first first-conductivity-type diffusion layer which is in contact with the first-conductivity-type layer and whose bottom part is in contact with the buried layer, a first second-conductivity-type diffusion layer formed in the first-conductivity-type layer such that a bottom part of the first second-conductivity-type diffusion layer is not in contact with the buried layer, a second second-conductivity-type diffusion layer formed in the first-conductivity-type layer such that a bottom part of the second second-conductivity-type diffusion layer is not in contact with the buried layer and such that a side face of the second second-conductivity-type diffusion layer is at least partially in contact with the first-conductivity-type layer, a second first-conductivity-type diffusion layer formed in the second second-conductivity-type diffusion layer such that the second first-conductivity-type diffusion layer is shallower than the second second-conductivity-type diffusion layer is, a first wiring coupled to a first first-conductivity-type high-concentration diffusion layer formed in a surface region of the first first-conductivity-type diffusion layer and coupled to a first second-conductive-type high-concentration diffusion layer formed in a surface region of the first second-conductivity-type diffusion layer, and a second wiring coupled to the second first-conductivity-type diffusion layer and a second second-conductive-type high-concentration diffusion layer formed in a surface region of the second second-conductivity-type diffusion layer, wherein the first first-conductivity-type high-concentration diffusion layer includes a region in which there is a contact coupled thereto, wherein the region in which there is the contact, the first second-conductivity-type diffusion layer, the second first-conductivity-type diffusion layer, and the second second-conductivity-type diffusion layer 140 are arranged in this order as viewed in plan view, and wherein in a region in which the second second-conductivity-type diffusion layer and the first-conductivity-type layer are in contact with each other, impurity concentrations of the second second-conductivity-type diffusion layer and the first-conductivity-type layer are higher in a part at a side face of the second second-conductivity-type diffusion layer than in apart at a bottom surface.

In this semiconductor device, a first bipolar transistor of a lateral type is formed by elements including the first second-conductivity-type diffusion layer, the first-conductivity-type layer, and the second second-conductivity-type diffusion layer, and a second bipolar transistor of a vertical type is formed by elements including the second first-conductivity-type diffusion layer, the second second-conductivity-type diffusion layer, and the first-conductivity-type layer. That is, a thyristor is formed by elements including the second firstconductivity-type diffusion layer, the second second-conductivity-type diffusion layer, the first-conductivity-type layer, and the second second-conductivity-type diffusion layer.

When the first wiring receives an abnormal voltage, the abnormal voltage is applied to the first-conductivity-type layer via the first first-conductivity-type diffusion layer and the buried layer. As a result, a voltage is applied between the first-conductivity-type layer and the second second-conductivity-type diffusion layer. In a region in which the second second-conductivity-type diffusion layer and the first-conductivity-type layer are in contact with each other, impurity concentrations thereof are higher in a part at a side face of the second second-conductivity-type diffusion layer than in a part at a bottom surface of the second second-conductivity-type diffusion layer. Therefore, electrical breakdown in the junction region between the second second-conductivity-type diffusion layer and the first-conductivity-type layer occurs not at the bottom surface but at the side face of the second second-conductivity-type diffusion layer. The triggering voltage of the thyristor is given by the voltage at which the breakdown occurs. Therefore, the triggering voltage of the thyristor is determined by the state of the side face of the second second-conductivity-type diffusion layer.

Thereafter, the first bipolar transistor of the lateral type and the second bipolar transistor of the vertical type turn on and thus thyristor starts to operate. After the thyristor starts to operate, a current flows through a path in a region where the second second-conductivity-type diffusion layer and the first-conductivity-type layer are in contact with each other wherein the current path in this region exists along a bottom surface of the second second-conductivity-type diffusion layer. Therefore, the holding voltage of the thyristor is determined by the state of the bottom surface of the second second-conductivity-type diffusion layer.

In the aspect of the present invention, as described above, factors that determine the triggering voltage of the thyristor are different from factors that determine the holding voltage of the thyristor. Therefore, it is possible to change the triggering voltage independently of the holding voltage.

Thus, the present invention provides a technique to change the triggering voltage of the thyristor used as the protection device independently of the holding voltage.

DETAILED DESCRIPTION

Figure 1:
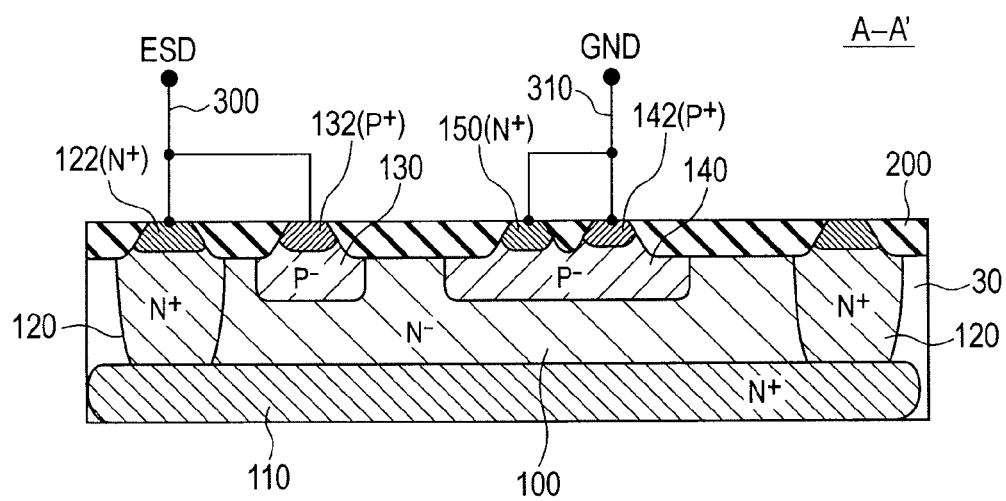
FIG. 1 is a cross-sectional view illustrating a structure of a semiconductor device according to a first embodiment of the present invention.

The present invention is described in further detail below with reference to embodiments in conjunction with the accompanying drawings. Similar elements are denoted by similar reference numerals/symbols throughout all figures, and duplicated descriptions are omitted.

First Embodiment

Figure 2:
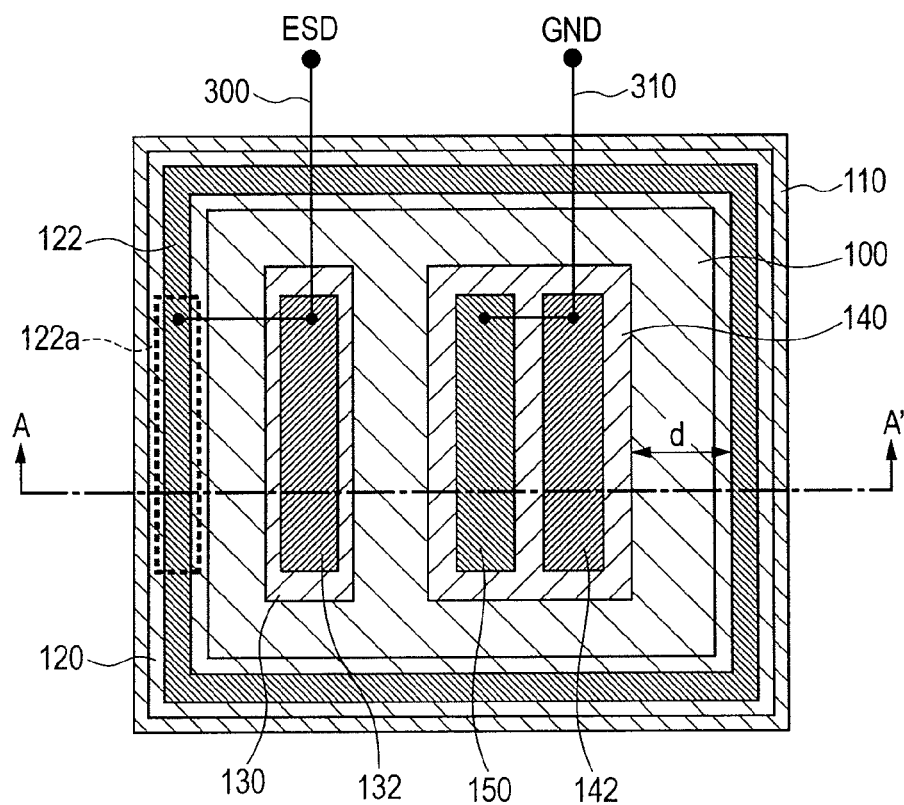
FIG. 2 is a plan view of the semiconductor device shown in FIG. 1.

FIG. 1 is a cross-sectional view illustrating a structure of a semiconductor device according to a first embodiment of the present invention. FIG. 2 is a plan view of the semiconductor device shown in FIG. 1. Note that in FIG. 2, an element isolation film 200 described below is not shown.

The semiconductor device includes a substrate 30, a first-conductivity-type layer 100, a first-conductivity-type (for example, n-type) buried layer 110, a first first-conductivity-type diffusion layer 120, a first second-conductivity-type (for example, p-type) diffusion layer 130, a second second-conductivity-type diffusion layer 140, a second first-conductivity-type diffusion layer 150, a first wiring 300, and a second wiring 310. The substrate 30 is, for example, a semiconductor substrate such as a Si substrate. The whole of the first-conductivity-type layer 100 and the whole of the first second-conductivity-type diffusion layer 130 both overlap the buried layer 110 as viewed in plan view, and the upper surface of the buried layer 110 is in contact with the first-conductivity-type layer 100. The impurity concentration of the buried layer 110 is higher than that of the first-conductivity-type layer 100. The first first-conductivity-type diffusion layer 120 is formed such that it is in contact with the first-conductivity-type layer 100 and the bottom of the first first-conductivity-type diffusion layer 120 is in contact with the buried layer 110. The first second-conductivity-type diffusion layer 130 is formed in the first-conductivity-type layer 100 such that the bottom of the first second-conductivity-type diffusion layer 130 is not in contact with the buried layer 110. The second second-conductivity-type diffusion layer 140 is formed in a surface region of the first-conductivity-type layer 100 such that the bottom of the second second-conductivity-type diffusion layer 140 is not in contact with the buried layer 110 and such that a side face of the second second-conductivity-type diffusion layer 140 is at least partially in contact with the first-conductivity-type layer 100. The second first-conductivity-type diffusion layer 150 is formed in the second second-conductivity-type diffusion layer 140 such that the second first-conductivity-type diffusion layer 150 is shallower than the second second-conductivity-type diffusion layer 140 is. The first wiring 300 is coupled to a high-concentration diffusion layer 122 and a high-concentration diffusion layer 132. The second wiring 310 is coupled to the second first-conductivity-type diffusion layer 150 and a second-conductive-type high-concentration diffusion layer 142.

The high-concentration diffusion layer 122 has a region 122a where a contact is disposed. When viewed in plan view, a part of the first first-conductivity-type diffusion layer 120 located immediately below the region 122a, the first second-conductivity-type diffusion layer 130, the second first-conductivity-type diffusion layer 150, and the second second-conductivity-type diffusion layer 140 are arranged in this order as viewed in plan view. In a region where the second second-conductivity-type diffusion layer 140 and the first-conductivity-type layer 100 are in contact with each other, the impurity concentrations thereof are higher in a part at a side face of the second second-conductivity-type diffusion layer 140 than in a part at a bottom surface of the second second-conductivity-type diffusion layer 140.

The semiconductor device includes an internal circuit formed therein although it is not shown in the figure. A protection device that protects the internal circuit from an abnormal voltage such as an electrostatic discharge voltage is formed by elements including the first-conductivity-type layer 100, the first-conductivity-type buried layer 110, the first first-conductivity-type diffusion layer 120, the first second-conductivity-type diffusion layer 130, the second second-conductivity-type diffusion layer 140, the second first-conductivity-type diffusion layer 150, the first wiring 300, and the second wiring 310 The first wiring 300 is a wiring on which an abnormal voltage (for example, an electrostatic discharge (ESD) voltage) can occur. The second wiring 310 is coupled to a ground wiring. A more detailed description of the semiconductor device is provided below.

When viewed in plan view, the first first-conductivity-type diffusion layer 120 has a shape such that the first first-conductivity-type diffusion layer 120 surrounds the first second-conductivity-type diffusion layer 130, the second first-conductivity-type diffusion layer 150 and the second second-conductivity-type diffusion layer 140. In the example shown in FIG. 2, the first first-conductivity-type diffusion layer 120 is formed such as to extend along four sides of a rectangle such as a square when viewed in plan view. The first second-conductivity-type diffusion layer 130, the second first-conductivity-type diffusion layer 150, and the second second-conductivity-type diffusion layer 140 are formed in a region surrounded by the first first-conductivity-type diffusion layer 120.

The first first-conductivity-type diffusion layer 120, the first second-conductivity-type diffusion layer 130, and the second second-conductivity-type diffusion layer 140 are formed such that they are apart from each other and such that the first-conductivity-type layer 100 surrounds the first second-conductivity-type diffusion layer 130 and the second second-conductivity-type diffusion layer 140, while the second second-conductivity-type diffusion layer 140 surrounds the second first-conductivity-type diffusion layer 150.

The high-concentration diffusion layer 122 is formed in a part of a surface region of the first first-conductivity-type diffusion layer 120. The high-concentration diffusion layer 122 is a diffusion layer of the first conductivity type with a higher impurity concentration than that of the first first-conductivity-type diffusion layer 120. The high-concentration diffusion layer 122 is formed such that it surrounds, in plan view, a region in which the high-concentration diffusion layer 132 and the second second-conductivity-type diffusion layer 140 are formed. In a region 122a in the high-concentration diffusion layer 122, multiple contacts (not shown) are formed such that they are arranged in a vertical direction in FIG. 2. The contacts may be arranged in a single line or multiple lines. The high-concentration diffusion layer 122 may be formed, for example, by an ion implantation process together with the second first-conductivity-type diffusion layer 150. In this case, the high-concentration diffusion layer 122 and the second first-conductivity-type diffusion layer 150 have the same impurity concentration and the same depth.

The high-concentration diffusion layer 132 is formed in a surface region of the first second-conductivity-type diffusion layer 130. The second-conductive-type high-concentration diffusion layer 142 is formed in a surface region of the second second-conductivity-type diffusion layer 140. The high-concentration diffusion layers 132 and 142 are diffusion layers of the second conduction type having higher impurity concentrations than those of the first second-conductivity-type diffusion layer 130 and the second second-conductivity-type diffusion layer 140.

The element isolation film 200 is formed over the surface of the semiconductor device. More specifically, in the region in which the protection device is formed, the element isolation film 200 is formed over the surface of the substrate 30 except for areas where the high-concentration diffusion layers 122, 132, and 142 are formed and an area where the second first-conductivity-type diffusion layer 150 is formed. The first first-conductivity-type diffusion layer 120, the first second-conductivity-type diffusion layer 130, and the second second-conductivity-type diffusion layer 140 are deeper than the element isolation film 200. In the present embodiment, the triggering voltage may be adjusted by a distance d from the second second-conductivity-type diffusion layer 140 to the first first-conductivity-type diffusion layer 120 and the high-concentration diffusion layer 122 as will be described in further detail later with reference to FIGS. 9A and 9B. Hereinafter, it is assumed that the distance d is the distance between the second second-conductivity-type diffusion layer 140 and the high-concentration diffusion layer 122.

Figure 3A:
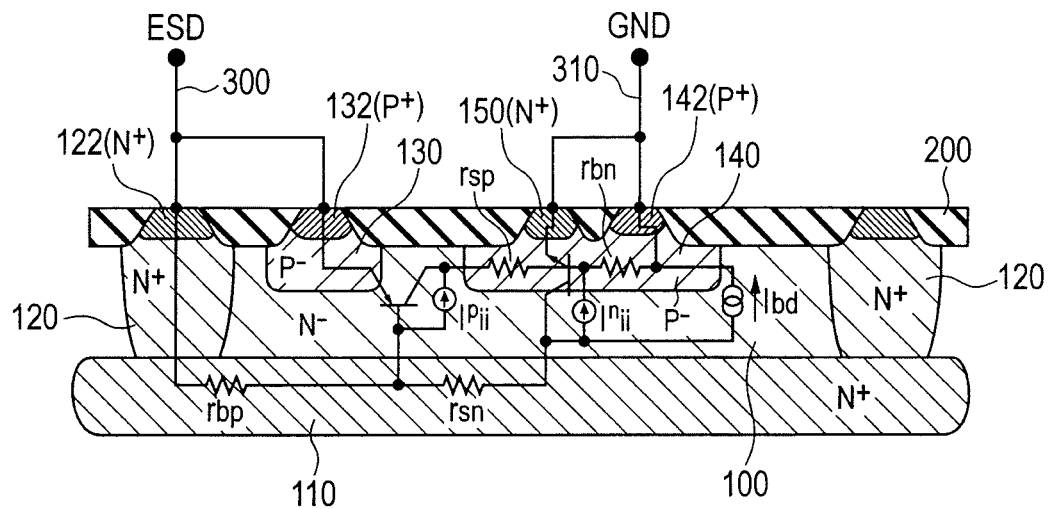
FIG. 3A is a cross-sectional view of the semiconductor device shown in FIG. 1 and FIG. 2.
Figure 3B:
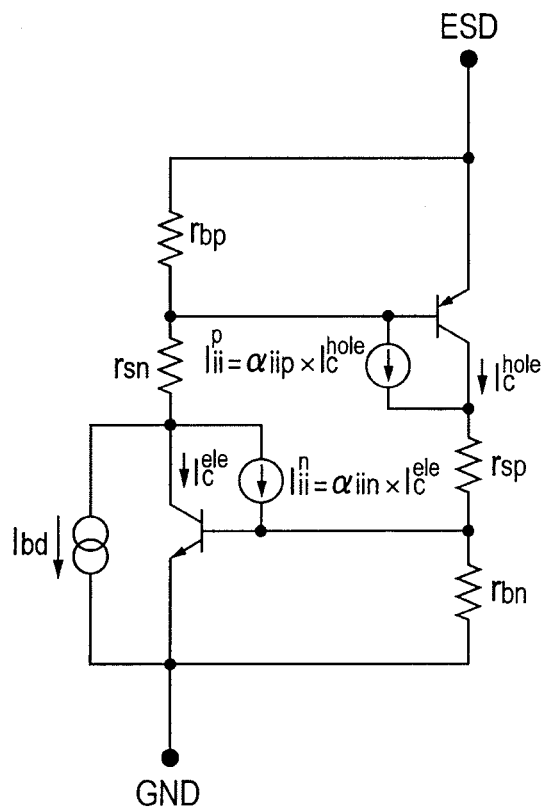
FIG. 3B is an equivalent circuit diagram of a protection device in the semiconductor device, wherein an equivalent circuit diagram identical to that shown in FIG. 3B is superimposed on the cross-sectional view shown in FIG. 3A.

FIG. 3A is a cross-sectional view of the semiconductor device on which an equivalent circuit diagram (shown in FIG. 3B) of the protection device shown in FIG. 1 and FIG. 2 is superimposed. The protection device includes a thyristor formed by elements including the first second-conductivity-type diffusion layer 130, the first-conductivity-type layer 100, the second second-conductivity-type diffusion layer 140, and the second first-conductivity-type diffusion layer 150. More specifically, the first second-conductivity-type diffusion layer 130, the first-conductivity-type layer 100, and the second second-conductivity-type diffusion layer 140 form a first bipolar transistor (for example, a pnp bipolar transistor) of the lateral type, while the second first-conductivity-type diffusion layer 150, the second second-conductivity-type diffusion layer 140, and the first-conductivity-type layer 100 form a second bipolar transistor (for example, an npn bipolar transistor) of the vertical type. The buried layer 110 and the first first-conductivity-type diffusion layer 120 provide a current path coupled to the first-conductivity-type layer 100. In the following description, it is assumed, by way of example, that the first bipolar transistor of the lateral type is a pnp bipolar transistor, and the second bipolar transistor of the vertical type is an npn bipolar transistor. And the first first-conductivity-type diffusion layer 120, the buried layer 110, the first-conductivity-type layer 100, and the second second-conductivity-type diffusion layer 140 each have a parasitic resistance (in the following description, it is called resistive component). For convenience in the following description, a symbol rbp is used to denote a series resistor of resistive components ranging from immediately below the first second-conductivity-type diffusion layer 130 to the first first-conductivity-type diffusion layer 120 on the left side among resistive components of the buried layer 110. Also for convenience of the following description, rsp and rbn are used to denote resistive components included in the second second-conductivity-type diffusion layer 140, where rsp denotes a resistive component of a collector of the lateral-type pnp bipolar transistor and more specifically the resistive component rsp ranges in the second second-conductivity-type diffusion layer 140 from immediately below the second first-conductivity-type diffusion layer 150 to the left end of the second second-conductivity-type diffusion layer 140, and the resistive component rbn is a resistive component of a base of the vertical-type npn bipolar transistor.

Figure 4A:
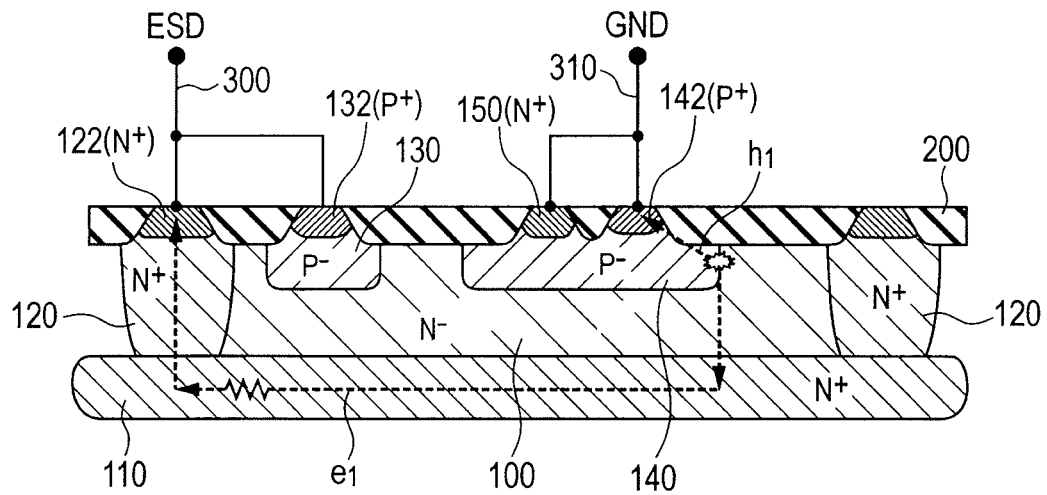
FIGS. 4A and 4B are a cross-sectional view and an equivalent circuit diagram illustrating an operation of the protection device shown in FIG. 1 and FIG. 2.
Figure 4B:
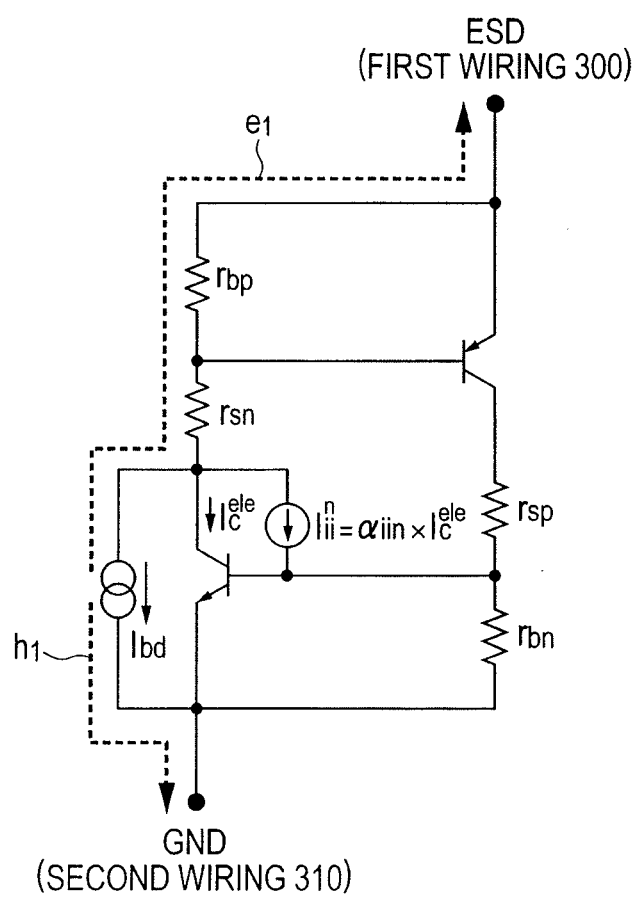
Figure 5A:
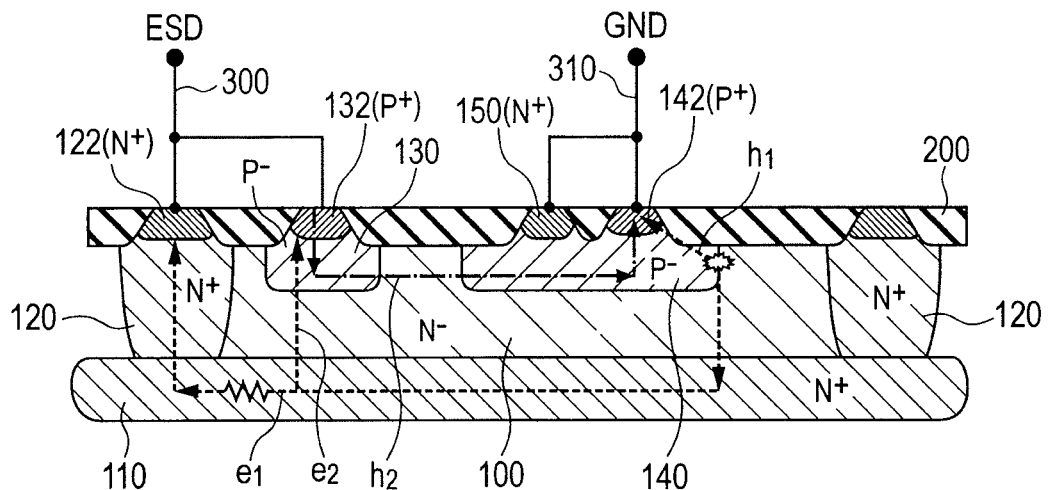
FIGS. 5A and 5B are a cross-sectional view and an equivalent circuit diagram illustrating an operation of the protection device shown in FIG. 1 and FIG. 2.
Figure 5B:
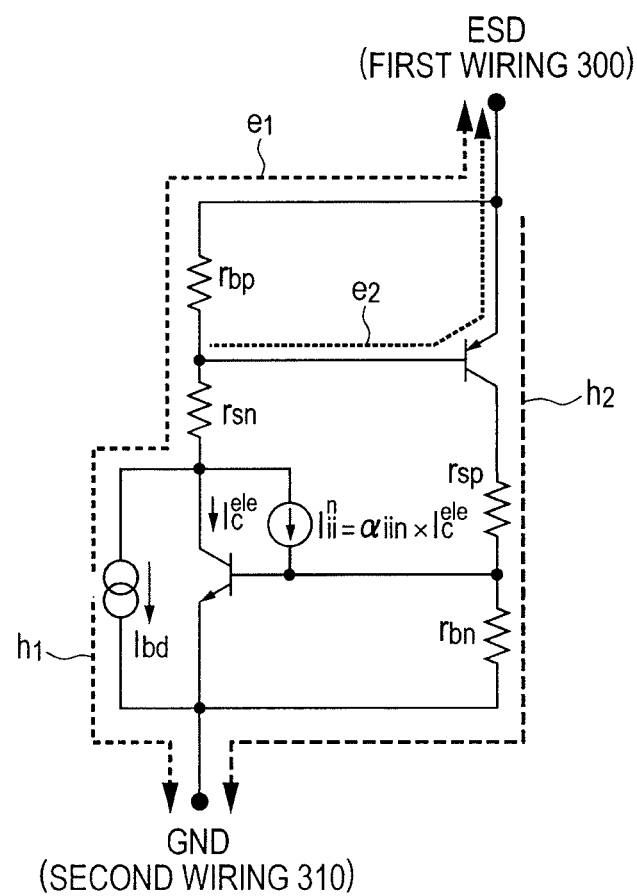
Figure 6A:
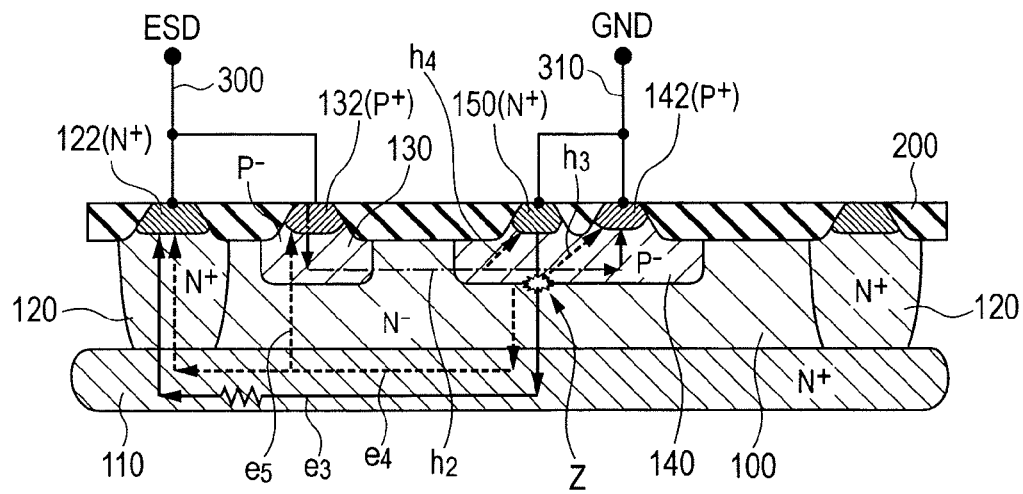
FIGS. 6A and 6B are a cross-sectional view and an equivalent circuit diagram illustrating an operation of the protection device shown in FIG. 1 and FIG. 2.
Figure 6B:
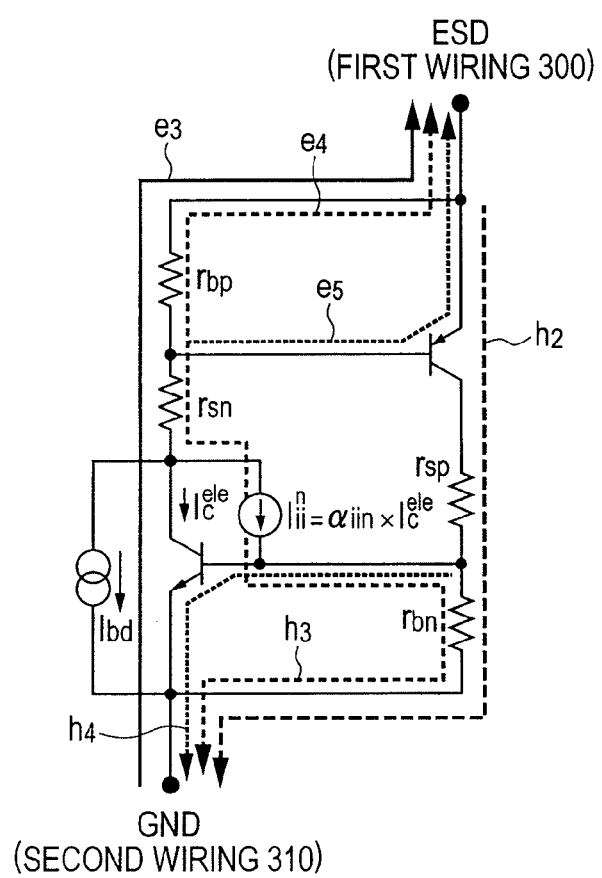
Figure 7:
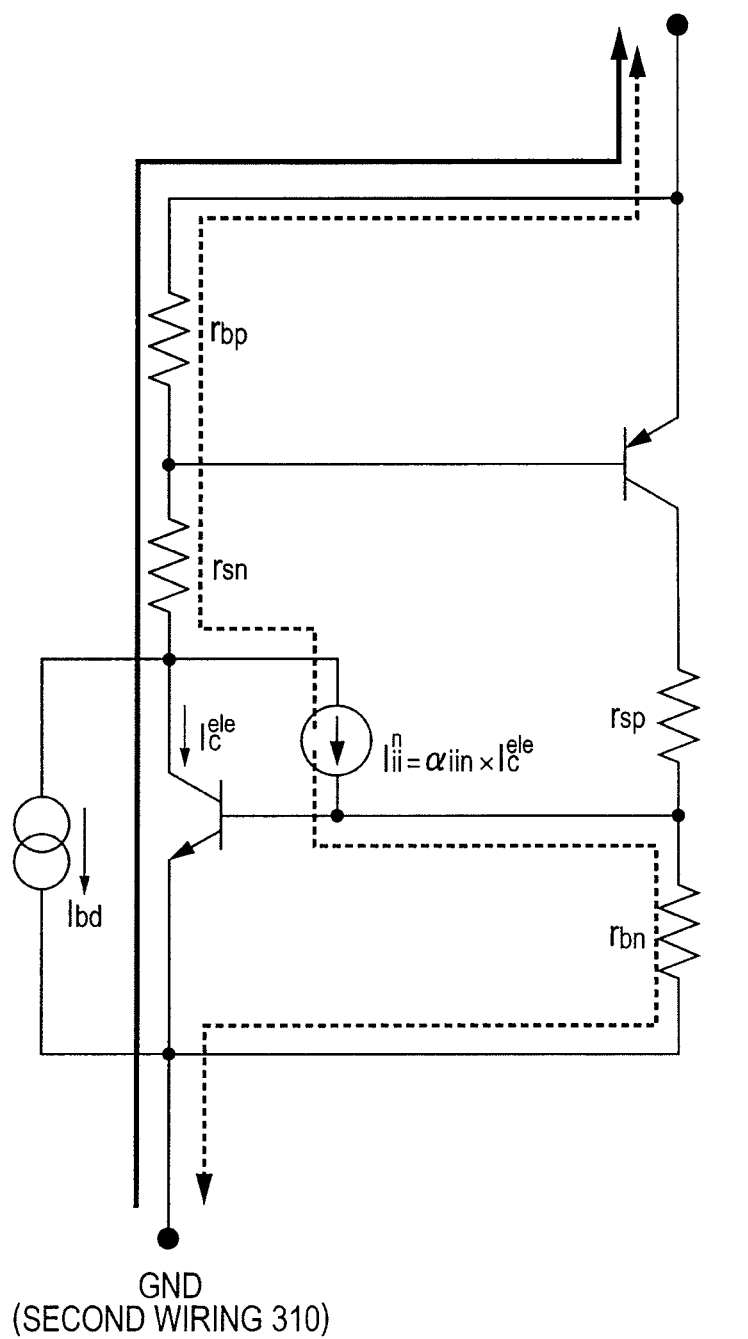
FIG. 7 is an equivalent circuit diagram illustrating an operation of the protection device shown in FIG. 1 and FIG. 2.

Next, an operation of the protection device shown in FIGS. 1 and 2 is described with reference to cross-sectional views shown in FIG. 4A, FIG. 5A, and FIG. 6A and equivalent circuit diagrams shown in FIGS. 4B, 5B, and 6B. Elements in the equivalent circuit diagrams shown in FIGS. 4B, 5B, and 6B corresponds to respective elements shown in FIG. 3. An impact ionization current $I_{ii}^p$ caused by a hole current in the operation of the lateral-type pnp bipolar transistor is smaller than $I_{ii}^n$ (which is an impact ionization current caused by a electron current in the operation of the vertical-type npn bipolar transistor) and has a smaller contribution to the operation. Therefore, for simplicity, the impact ionization current $I_{ii}^p$ is omitted in the equivalent circuit diagrams shown in FIG. 4B, FIG. 5B, and FIG. 6B. Actually, the impact ionization current $I_{ii}^p$ provides an effect similar to that provided by the impact ionization current $I_{ii}^n$ although the effect by the impact ionization current $I_{ii}^p$ is weak. When the first wiring 300 receives an abnormal voltage, the abnormal voltage is applied to the first-conductivity-type layer 100 via the high-concentration diffusion layer 122, the first first-conductivity-type diffusion layer 120, and the buried layer 110. As a result, a voltage appears between the first-conductivity-type layer 100 and the second second-conductivity-type diffusion layer 140. As described above, in the region where the second second-conductivity-type diffusion layer 140 and the first-conductivity-type layer 100 are in contact with each other, the impurity concentration is higher in a part at the side face of the second second-conductivity-type diffusion layer 140 than in a part at the bottom surface of the second second-conductivity-type diffusion layer 140. Therefore, as shown in FIG. 4A, in the junction region between the second second-conductivity-type diffusion layer 140 and the first-conductivity-type layer 100, electrical breakdown occurs not at the bottom surface but at the side face of the second second-conductivity-type diffusion layer 140. Holes generated by the electrical breakdown move as a hole current h1 toward the second-conductive-type high-concentration diffusion layer 142 as denoted by an arrow in FIG. 4A, while electrons generated by the electrical breakdown move as an electron flow e1 as denoted by an arrow in FIGS. 4A and 4B to the high-concentration diffusion layer 122 via the buried layer 110 and the first first-conductivity-type diffusion layer 120. In the equivalent circuit diagram shown in FIG. 4B, the electron flow e1 generated by the electrical breakdown flows to the first wiring 300 via resistors rsn and rbp shown in FIGS. 3A and 3B, while the hole current h1 flows directly to the second wiring 310. Note that the direction of the electron flow (flow of electron) is defined as a direction in which electrons actually flow. Therefore, the direction of the electron current is opposite to the direction in which the electric current.

The flow of electrons to the high-concentration diffusion layer 122 causes a voltage drop to occur across the resistance of the first first-conductivity-type diffusion layer 120 and a voltage drop to occurs across a part of the resistance of the buried layer 110, which creates a reduction in potential of the first-conductivity-type layer 100. As a result, the potential of the first-conductivity-type layer 100 drops down at a location below the first second-conductivity-type diffusion layer 130. Thus, the potential of the first-conductivity-type layer 100 at the location below the first second-conductivity-type diffusion layer 130 becomes lower than that of the first second-conductivity-type diffusion layer 130. As a result, as shown in FIG. 5A and FIG. 5B, a diode formed by the first second-conductivity-type diffusion layer 130 and the first-conductivity-type layer 100 turns on, and a hole current flows from the first second-conductivity-type diffusion layer 130 to the first-conductivity-type layer 100, which causes the pnp bipolar transistor to start operating. As a result, a hole current h2, which is a current provided by holes serving as carries, flows between the first second-conductivity-type diffusion layer 130 and the second second-conductivity-type diffusion layer 140. In the equivalent circuit shown in FIG. 5B, the hole current h2 flows from the first wiring 300 to the second wiring 310 via the resistors rsp and rbn shown in FIG. 3. Note that in the operation of the diode formed by the first second-conductivity-type diffusion layer 130 and the first-conductivity-type layer 100, the above-described electron flow e1 partially flows as an electron flow e2 from the first-conductivity-type layer 100 to the first second-conductivity-type diffusion layer 130.

If the hole current h2 flows through the first second-conductivity-type diffusion layer 130, the first-conductivity-type layer 100, the second second-conductivity-type diffusion layer 140, and the second-conductive-type high-concentration diffusion layer 142 in this order as described in FIG. 6, the second second-conductivity-type diffusion layer 140 has an increase in voltage due to the resistor rbn. As a result, the potential of the second second-conductivity-type diffusion layer 140 becomes higher, at a location below the second first-conductivity-type diffusion layer 150, than the ground potential. This causes a diode formed by elements including the second first-conductivity-type diffusion layer 150 and the second second-conductivity-type diffusion layer 140 to turn on, and thus the vertical-type npn bipolar transistor starts to operate. As a result, an electron flow e3 flows through the second first-conductivity-type diffusion layer 150, the second second-conductivity-type diffusion layer 140, the first-conductivity-type layer 100 the buried layer 110, the first first-conductivity-type diffusion layer 120, and the high-concentration diffusion layer 122 in this order. Note that an electric current due to the electron flow e3 flows in a direction opposite to the direction in which the electron flow e3 flows.

The electron flow e3 passes through a depletion layer formed close to a junction between the second second-conductivity-type diffusion layer 140 and the first-conductivity-type layer 100. As shown in FIGS. 6A and 6B, when the electron flow e3 passes through the depletion layer, a strong electric field existing in the depletion layer causes impact ionization to occur as indicated by an arrow Z in FIG. 6A. As a result, electron-hole pairs are generated. The generated electrons move as an electron flow e4 together with the electron flow e3. An electron flow e5, which is a part of the electron flow which is mixture of the electron flow e3 and the electron flow e4, flows as a base current in the pnp bipolar transistor. On the other hand, the hole current h3 generated by the impact ionization moves toward the second-conductive-type high-concentration diffusion layer 142 and the second wiring 310. The flow of the hole current h3 causes the second second-conductivity-type diffusion layer 140 to have an increase in voltage due to the resistor rbn. As a result, the second second-conductivity-type diffusion layer 140 further increases in potential at a location below the second first-conductivity-type diffusion layer 150, and the operation of the vertical-type npn bipolar transistor formed by elements including the second first-conductivity-type diffusion layer 150, the second second-conductivity-type diffusion layer 140, and the first-conductivity-type layer 100 makes the shift from by the hole current h2 into by the hole current h3 generated by the impact ionization. Because the hole current h2 originates from the breakdown current Ibd, the above-described shifting can also be regarded as shifting that the vertical-type npn bipolar transistor formed by the second first-conductivity-type diffusion layer 150, the second second-conductivity-type diffusion layer 140, and the first-conductivity-type layer 100 shifted from the operation occurs by the breakdown current Ibd into the operation occurs by the hole current h3 generated by the impact ionization. In the impact ionization current caused by the electron flow e3, a particular amount of current can be generated by a lower voltage than a voltage required to generate the same amount of current caused by the breakdown current Ibd. This means that if the breakdown current Ibd and the hole current h3 indicate the same current value, the hole current h3 is generated by a smaller voltage than a voltage that is necessary to generate the breakdown current Ibd. This is because Ibd is caused by the breakdown in which a particular number of carriers are generated starting from a small seed current, while the hole current h3 is caused by the impact ionization in which a particular number of carriers are generated starting from a large seed current supplied by the electron flow e3. That is, the large amount of seed current provided for the hole current h3 makes it possible to generate a particular number of carries by a smaller voltage than a voltage necessary to generate the same particular number of carries in Ibd. As a result of the above-described transition of the state, the npn bipolar transistor goes to a snap-back state. This causes a reduction to occur in the voltage between the first wiring 300 and the second wiring 310, and thus, as shown in FIG. 6B, a voltage necessary to generate Ibd is not supplied, and generation of Ibd by breakdown stops. Because the high-concentration buried layer 110 exists below the second second-conductivity-type diffusion layer 140, the electron flow e3 by the npn bipolar transistor flows not along the side face but along the bottom surface of the second second-conductivity-type diffusion layer 140. Note that the direction of the electron current caused by the electron flow e3 is opposite to the direction of the electron flow e3. In the equivalent circuits shown in FIG. 6A and FIG. 6B, a hole current h4, which is partial current of sum of the hole current h2 and the hole current h3, flows as a base current h4 of the vertical-type npn bipolar transistor from the second second-conductivity-type diffusion layer 140 to the second wiring 310 via the second first-conductivity-type diffusion layer 150.

The hole current and the electron current between the first second-conductivity-type diffusion layer 130 and the second second-conductivity-type diffusion layer 140 also pass through the junction and thus impact ionization occurs. The holes generated by the impact ionization enhance the operations of the vertical-type npn bipolar transistor and the lateral-type pnp bipolar transistor. Note that in the operation of the thyristor according to the present embodiment, unlike the ordinary thyristors, the operation of the npn bipolar transistor is not perfectly based on the feedback from the pnp bipolar transistor, and thus the operation is not of a 100% thyristor operation but of a partial thyristor operation. In the present invention, such a partial thyristor operation is regarded as a thyristor operation.

Figures 9A, 9B:
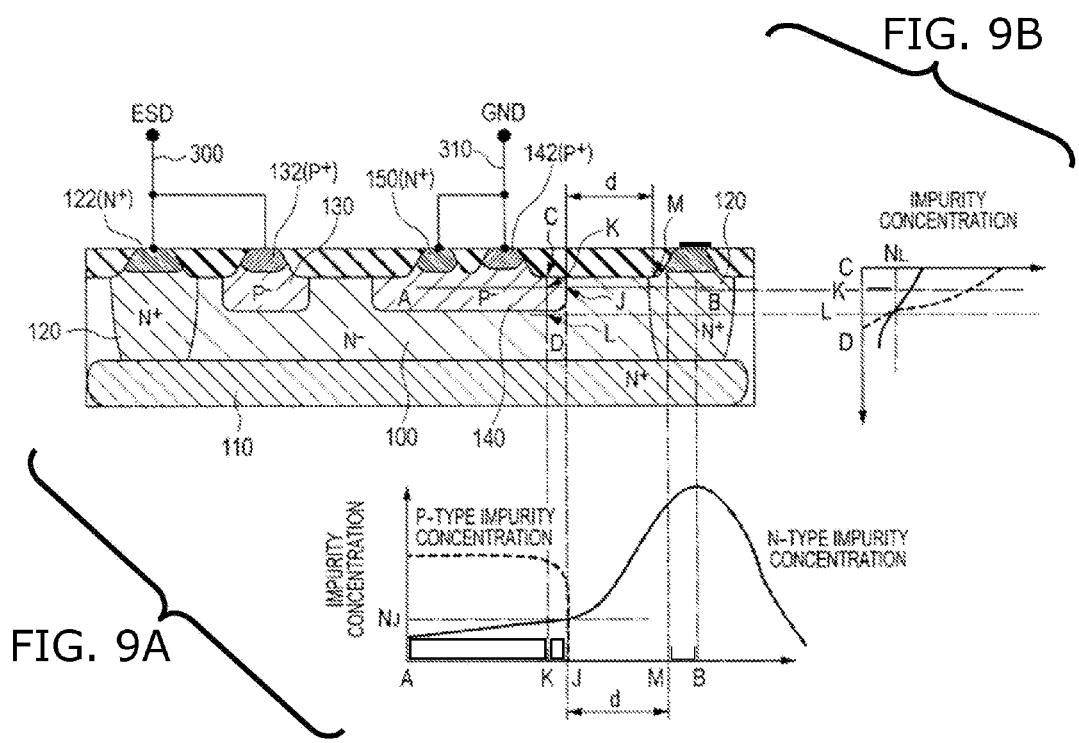
FIGS. 9A and 9B are diagrams illustrating an example of a method of adjusting a triggering voltage.

In the present embodiment, in the thyristor operation, currents (e3, h2, h3, e4, h4, and e5 shown in FIGS. 6A and 6B) do not pass along the face of the side of the element isolation film 200 of the junction formed between the second second-conductivity-type diffusion layer 140 and the first-conductivity-type layer 100 and which is a part where the initial breakdown occurs, and thus this part of the junction on the side of the element isolation film 200 does not contribute to the determination of the holding voltage. Therefore, even if the distance d shown in FIG. 9A is changed to control (change) the impurity concentration at a region close to the junction, no change occurs in the holding voltage. This makes it possible to adjust the triggering voltage without changing the holding voltage.

Figure 8:
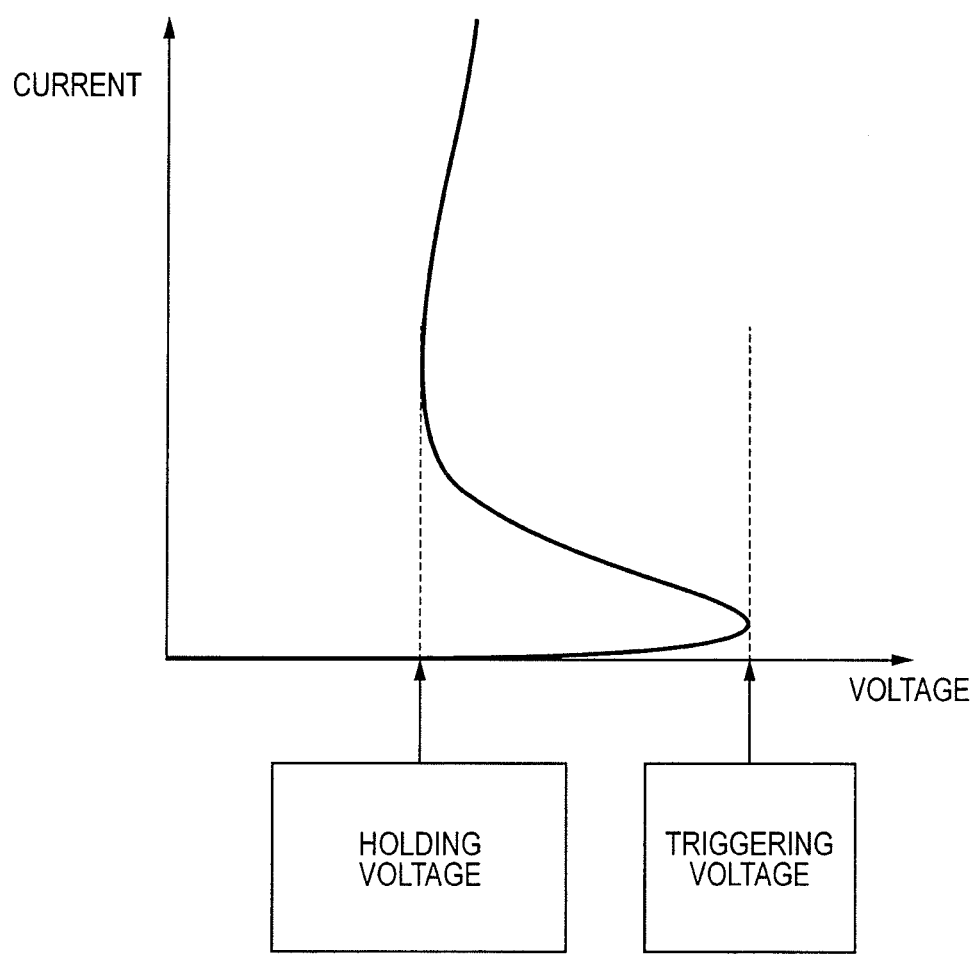
FIG. 8 is an I-V characteristic diagram illustrating a current flowing between a first wiring and a second wiring as a function of a voltage applied between the first wiring and the second wiring.

FIG. 8 illustrates an I-V characteristic of a current flowing between the first wiring 300 and the second wiring 310 as a function of a voltage applied between the first wiring 300 and the second wiring 310. The triggering voltage is a voltage at which the ESD protection device starts to operate, and the holding voltage is a voltage at which the current becomes minimum when a current flows through the ESD protection device. As described above, it is preferable that the protection device is configured such that the triggering voltage and the holding voltage are allowed to be set independently.

In an initial stage of the operation, a small increase in current can lead to a large increase in voltage because a charge is stored in parasitic capacitance associated with the junction between the collector (the first-conductivity-type layer 100) of the npn bipolar transistor and the base (second second-conductivity-type diffusion layer 140), and this results in an increase in the voltage across the parasitic capacitance. When the voltage across the parasitic capacitance reaches a reverse breakdown voltage of the junction, breakdown occurs as shown in FIG. 4A. As described above, the breakdown functions as a trigger that makes the thyristor start to operate. Therefore, the triggering voltage of the thyristor is given by the voltage at which the breakdown occurs.

The current caused by the breakdown can be considered as a current source (Ibd shown in FIGS. 3A and 3B and other figures) located on a side face, opposing the first first-conductivity-type diffusion layer 120 shown on the right-hand side of the figure, which is a part between the collector (first-conductivity-type layer 100) and the base (second second-conductivity-type diffusion layer 140) of the npn bipolar transistor. As described above with reference to FIGS. 4A and 4B and FIGS. 5A and 5B, the current generated by the breakdown flows into the resistor (second second-conductivity-type diffusion layer 140), which causes the npn bipolar transistor to finally turn on. Furthermore, the npn bipolar transistor goes into the snap-back state, and thus the ESD terminal voltage drops down to the holding voltage shown in FIG. 8.

Referring to FIGS. 6A, 6B, 7, and 8, a supplemental description of the thyristor operation is given below. First, referring to FIG. 7, a description is given as to a manner in which the holding voltage is determined in a case where only the vertical-type npn bipolar transistor operates. In this case, to obtain a current of a value Iesd flowing from the first wiring 300, the holding voltage Vesd is necessary to have the following value:

$$Vesd=[\text{voltage drop across } rbp]+[\text{voltage drop across } rsn]+Vbc+Veb$$

where Vbc denotes a reverse voltage of a collector-base diode and Veb denotes a voltage necessary to obtain a forward current flowing through the emitter-base diode. As shown in FIG. 8, the holding voltage is a minimum voltage that the device has after the device starts to pass the current. At the holding voltage, the current is generally small. That is, the voltage drop across rbp and the voltage drop across rsn are much smaller than Vesd. Therefore, the equation described above can be approximated as follows:

$$Vesd \approx Vbc+Veb$$

When the device has a relatively high breakdown voltage, Vbc is much greater than Veb. That is, Veb is a voltage necessary to have a forward current flowing through the emitter-base diode as described above and thus Veb is a few volts at most. On the other hand, Vbc is lower than a reverse breakdown voltage of the collector-base diode, but close to the breakdown voltage, and thus, in the device having a relatively high breakdown voltage, Vbc is set to be correspondingly high. Hereinafter, for convenience of explanation, it is assumed that Vbc≧Veb and the holding voltage are described in the case where this assumption holds. In this case, the equation can be further approximated as follows:

$$Vesd \approx Vbc$$

In a state in which the device passes a current with around the holding voltage, the voltage of the device is nearly equal to the base-collector voltage Vbc.

Next, a description is given below as to how Vbc is determined. In a case where the value of a current to be passed through the device has already been determined, and this current is flowing through the device, Vbc must have a value that allows a necessary base current to flow. The voltage Vbc is applied as a reverse voltage between the collector and the base. Therefore, the voltage Vbc creates a depletion layer between the collector and base, and an electric field corresponding to Vbc appears in this depletion layer. When a current (in which electrons function as carries) flowing between the emitter and the collector passes through this depletion layer, impact ionization occurs, which generates electron-hole pairs. A current caused by the generated holes flows into the base. This base current causes a current to flow between the emitter and collector. The emitter-collector current is a current that should be passed through the device, and has a particular fixed value. To obtain this current, it is necessary to provide a particular amount of base current. To obtain this particular amount of base current, the electric field in the depletion layer between the collector and the base needs to have a particular strength. Thus Vbc is inevitably determined to have the particular necessary value.

Next, referring to FIGS. 6A and 6B, a description is given below as to a case in which the lateral-type pnp bipolar transistor also has a contribution to the operation. When the pnp bipolar transistor operates, the hole current h2 originating from the pnp bipolar transistor flows into rbn shown in FIG. 6B (not shown in FIG. 6A), which leads to an increase in voltage due to the rbn. This leads to a further increase in the base potential of the npn bipolar transistor, which causes an increase in the electron flow e3 from the emitter. As a result, an increase occurs in the current flowing through the npn bipolar transistor.

The current flowing through the second wiring 310, i.e., the current to be discharged has a predetermined value. Therefore, even if the amount of the current allowed to flow through the npn bipolar transistor is tried to be increased by increasing the base current (equal to h3+additional h2) of the npn bipolar transistor thereby increasing the base potential increases, the necessary additional current is not supplied. Thus, in the npn bipolar transistor, the collector-emitter voltage decreases such that the current is maintained to be constant. As a result, a reduction occurs in the voltage across the depletion layer between the collector and the base, and thus the current generated by the impact ionization decreases. Thus, in a state in which the voltage is low at the terminal (the first wiring 300) to which ESD is applied, it becomes possible to pass the same amount of current (I_esd) as the current allowed to be passed in the state in which the pnp bipolar transistor is not in operation. That is, the operation of the pnp bipolar transistor leads to a reduction in the holding voltage.

As described above, in the circuit shown in FIG. 3B and FIG. 6B, all circuit elements except for the current source that provides Ibd are factors that determine the holding voltage. These circuit elements exist in the current path of the thyristor, and thus these circuit elements can affect the holding voltage of the thyristor. Thus, as described above, by setting the part (the current source that provides Ibd shown in FIG. 3) where the breakdown functioning as the trigger of the thyristor occurs such that the part is unrelated with the current path of the thyristor operation, it becomes possible to adjust the triggering voltage and the holding voltage independently of each other.

Next, effects and advantages of the present embodiment of the invention are described. In the region where the second second-conductivity-type diffusion layer 140 and the first-conductivity-type layer 100 are in contact with each other, the impurity concentrations are higher in the part in contact with a side face of the second second-conductivity-type diffusion layer 140 than in a part in contact with the bottom of the second second-conductivity-type diffusion layer 140. Therefore, as shown in FIG. 4A, when the first wiring 300 receives an abnormal voltage, electrical breakdown in the junction region between the second second-conductivity-type diffusion layer 140 and the first-conductivity-type layer 100 occurs not at the bottom surface but at the side face of the second second-conductivity-type diffusion layer 140. On the other hand, when the thyristor is in operation, the current flows not along the side face but along the bottom face of the second second-conductivity-type diffusion layer. That is, as shown in FIG. 4A, the breakdown occurs at a location that is not on the path in which the current flows in the thyristor operation (see FIG. 6). Therefore, the triggering voltage is determined by the state of the side face of the second second-conductivity-type diffusion layer 140 without being influenced by the condition that determines the holding voltage of the thyristor, i.e., regardless of the state of the bottom face of the second second-conductivity-type diffusion layer 140. Thus, it is possible to adjust the triggering voltage independently of the holding voltage.

Next, referring to FIGS. 9A and 9B, a specific example of a method of adjusting the triggering voltage is described below. FIG. 9A illustrates an impurity concentration distribution taken in an A-B cross section. FIG. 9B illustrates an impurity concentration distribution taken in a C-D cross section. More specifically, the A-B cross section is taken from the second second-conductivity-type diffusion layer 140 to the first first-conductivity-type diffusion layer 120 located adjacent to the second second-conductivity-type diffusion layer, while the C-D cross section is taken in the second second-conductivity-type diffusion layer 140 to indicate the impurity concentration distribution in a depth direction.

As can be seen from a graph shown in FIG. 9A, a boundary between the first-conductivity-type layer 100 and the second second-conductivity-type diffusion layer 140 can be defined as a point (denoted by a symbol "J") at which the concentration of the impurity of the first conductivity type is equal to that of the impurity of the second conduction type. The concentration of impurities of the first conductivity type increases as the position approaches the first first-conductivity-type diffusion layer 120. Therefore, if the location of the second second-conductivity-type diffusion layer 140 is shifted toward the first first-conductivity-type diffusion layer 120, the impurity concentration at the boundary between the first-conductivity-type layer 100 and the second second-conductivity-type diffusion layer 140 increases. This means that the triggering voltage of the thyristor can be adjusted by adjusting the distance d between the second second-conductivity-type diffusion layer 140 and the first first-conductivity-type diffusion layer 120.

The graph shown in FIG. 9B illustrates a manner in which the concentration of the first-conductivity-type layer 100 is determined in a region close to the bottom of the second second-conductivity-type diffusion layer 140. In the region close to the bottom of the second second-conductivity-type diffusion layer 140, the impurity distribution of the first-conductivity-type layer 100 is determined by an impurity profile of ion implantation in the depth direction, regardless of the distance d shown in FIG. 9A (from the second second-conductivity-type diffusion layer 140 to the high-concentration diffusion layer 122). Therefore, by adjusting the distance d, it is possible to increase or decrease the impurity concentration of the first-conductivity-type layer 100 in the region on the side face of the second second-conductivity-type diffusion layer 140 without affecting the impurity concentration of the first-conductivity-type layer 100 in the region on the side of the bottom of the second second-conductivity-type diffusion layer 140.

Figure 10A:
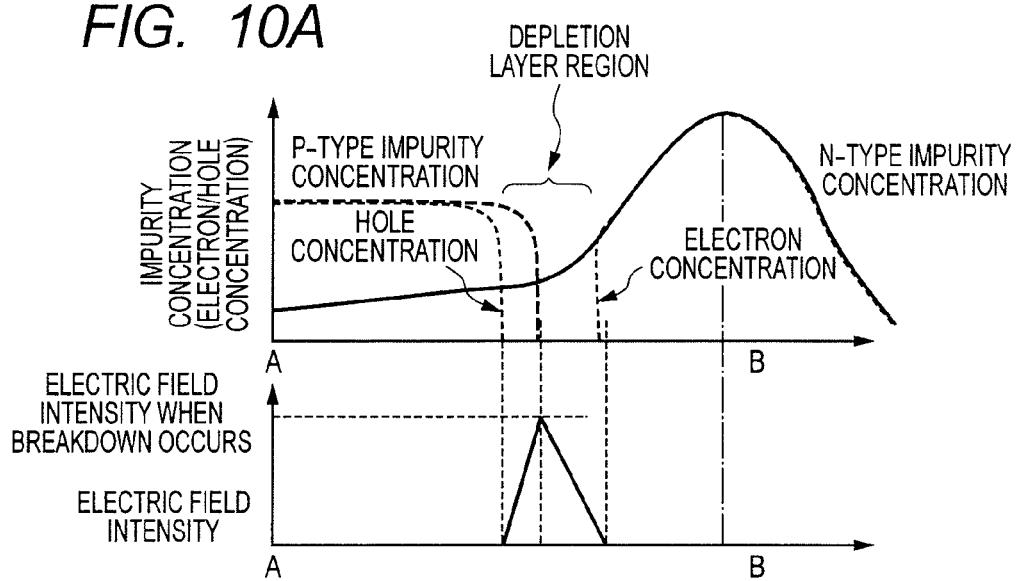
FIGS. 10A and 10B are diagrams illustrating a state of a depletion layer and an electric field in the depletion layer in a state in which a breakdown occurs (in which a triggering voltage is applied) for different values of the distance d shown in FIG. 9.
Figure 10B:
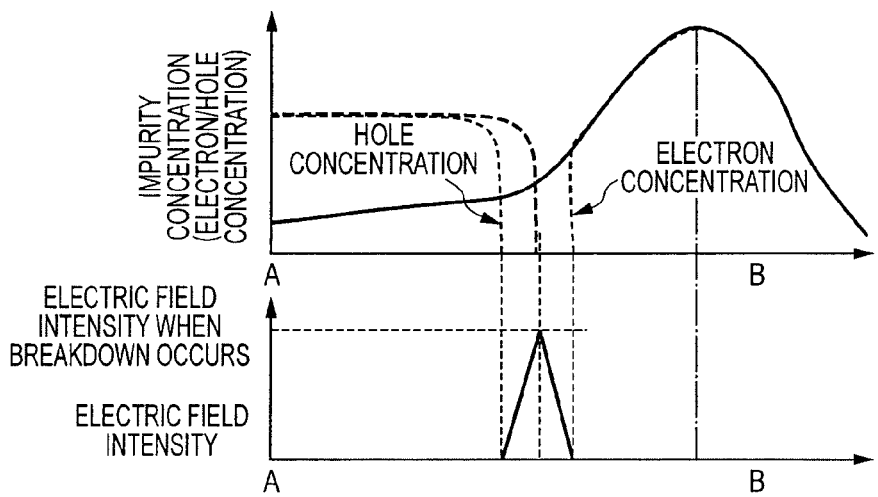

FIGS. 10A and 10B are diagrams illustrating a state of a depletion layer and an electric field in the depletion layer in a state in which a breakdown occurs (in which a triggering voltage is applied) for different values of the distance d shown in FIG. 9. In FIG. 10A, the distance d is set to be large, while the distance d is set to be small in FIG. 10B. Note that breakdown occurs at the same electric field intensity regardless of the distance d. On the other hand, the impurity concentration in the boundary region between the p-type diffusion layer and the n-type diffusion layer increases with decreasing distance d. Therefore, the width of the depletion layer formed at the boundary between the p-type diffusion layer and the n-type diffusion layer is smaller in FIG. 10B than in FIG. 10A. Because the breakdown voltage is given by the integral of the electric field intensity, the breakdown voltage and thus the triggering voltage increase with the distance d.

Figure 28:
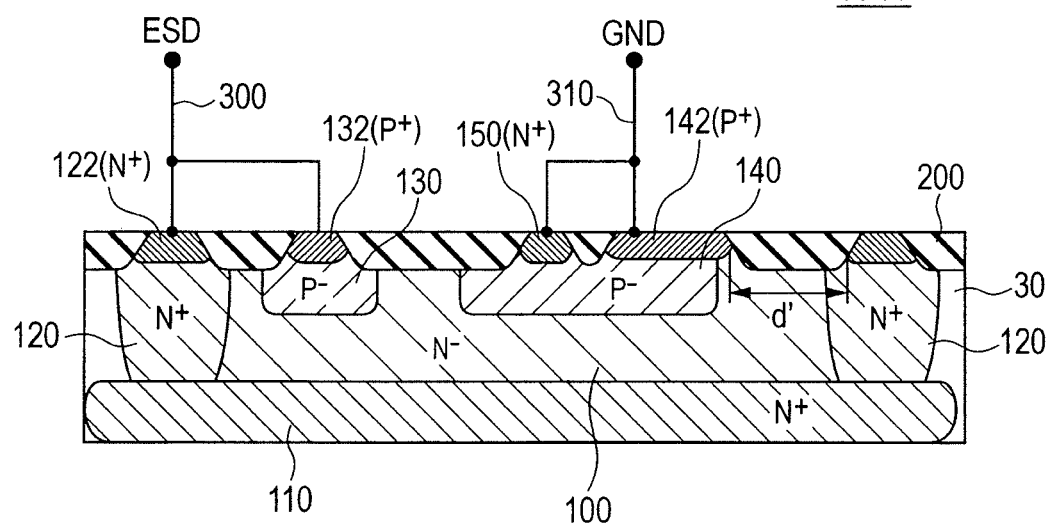
FIG. 28 is a cross-sectional view illustrating a modification of the semiconductor device according to the first embodiment of the present invention.

Note that in a case where the second-conductive-type high-concentration diffusion layer 142 has a part extending beyond the edge of the second second-conductivity-type diffusion layer 140 toward the first first-conductivity-type diffusion layer 120 as shown in FIG. 28, the breakdown shown in FIG. 4 occurs not at the side face of the boundary between the second second-conductivity-type diffusion layer 140 and the first first-conductivity-type diffusion layer 120 but in a boundary between the second-conductive-type high-concentration diffusion layer 142 and the first-conductivity-type diffusion layer 100. In this case, the triggering voltage of the thyristor can be adjusted by adjusting the distance d' between the second-conductive-type high-concentration diffusion layer 142 and the high-concentration diffusion layer 122.

Second Embodiment

Figure 11:
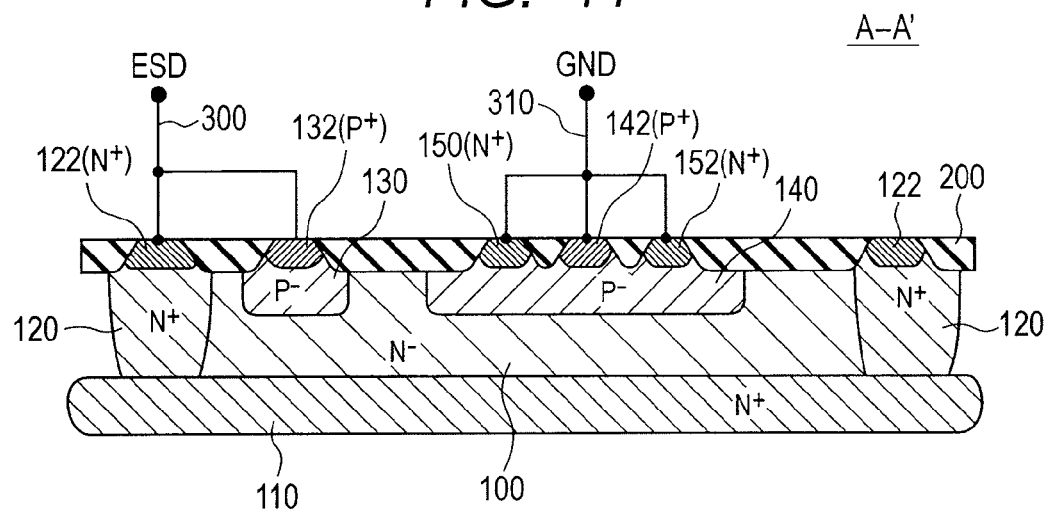
FIG. 11 is a cross-sectional view of a semiconductor device according to a second embodiment of the present invention.
Figure 12:
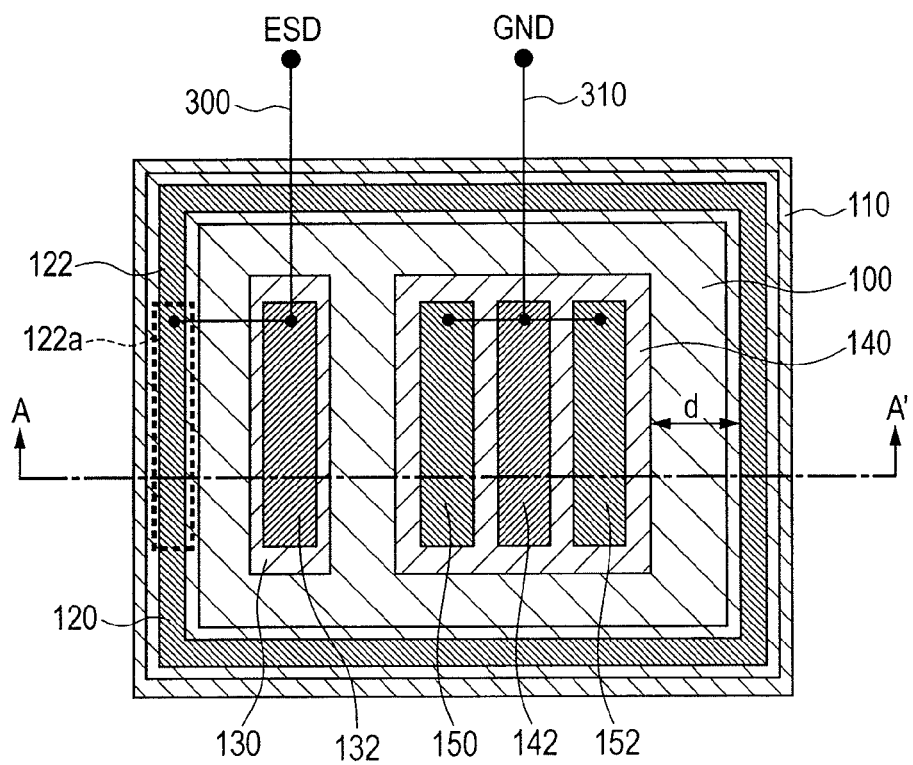
FIG. 12 is a plan view of the semiconductor device shown in FIG. 11.
Figure 29:
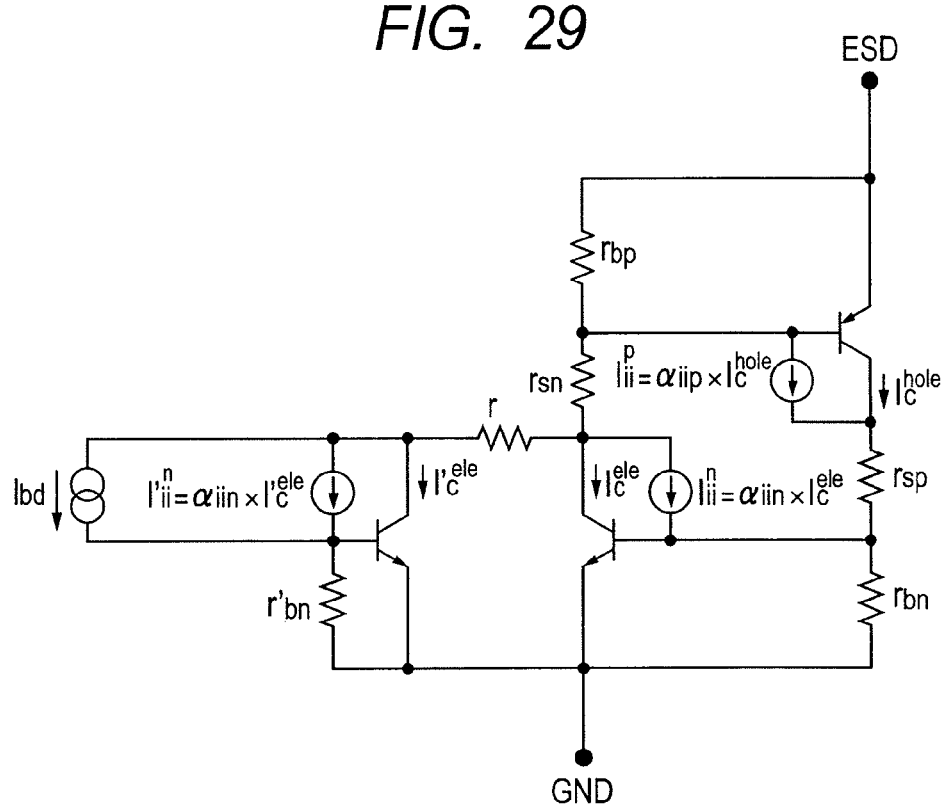
FIG. 29 is an equivalent circuit diagram of the semiconductor device shown in FIG. 11.

FIG. 11 is a cross-sectional view illustrating a structure of a semiconductor device according to a second embodiment of the present invention. This figure corresponds to FIG. 1 associated with the first embodiment. FIG. 12 is a plan view of the semiconductor device shown in FIG. 11, and this figure corresponds to FIG. 2 associated with the first embodiment. The semiconductor device according to the present embodiment is similar to that according to the first embodiment except that the protection device further includes a third first-conductivity-type diffusion layer 152. FIG. 29 is an equivalent circuit diagram of the semiconductor device shown in FIG. 11. FIG.

30 is a diagram in which the equivalent circuit diagram shown in FIG. 29 is superimposed on the cross-sectional view of the semiconductor device shown in FIG. 11.

Figure 30:
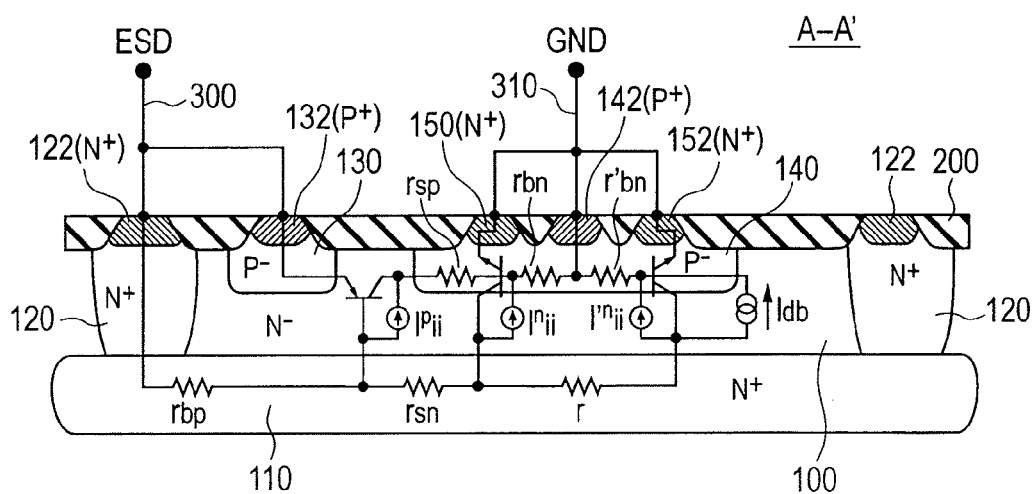
FIG. 30 is a diagram in which the equivalent circuit diagram shown in FIG. 29 is superimposed on the cross-sectional view of the semiconductor device shown in FIG. 11.

The third first-conductivity-type diffusion layer 152 is formed in the second second-conductivity-type diffusion layer 140 such that the third first-conductivity-type diffusion layer 152 opposes the second first-conductivity-type diffusion layer 150 via the second-conductive-type high-concentration diffusion layer 142. The second wiring 310 is also coupled to the third first-conductivity-type diffusion layer 152. The third first-conductivity-type diffusion layer 152 may be formed, for example, in a similar manner to the second first-conductivity-type diffusion layer 150. The third first-conductivity-type diffusion layer 152 does not necessarily need to be similar in shape or depth to the second first-conductivity-type diffusion layer 150 as long as the third first-conductivity-type diffusion layer 152 is formed in a surface region of the second second-conductivity-type diffusion layer 140. As shown in FIG. 29 and FIG. 30, the semiconductor device according to the present embodiment has a similar circuit configuration to that of the semiconductor device according to the first embodiment except that two vertical-type npn bipolar transistors are disposed in parallel.

Figure 13A:
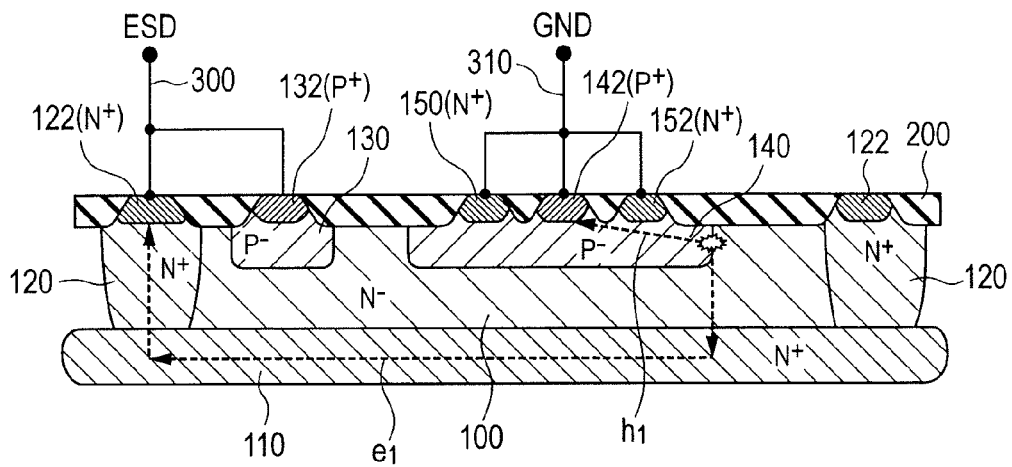
FIGS. 13A and 13B are a cross-sectional view and an equivalent circuit diagram illustrating an operation of a protection device shown in FIG. 11 and FIG. 12 in a first operation mode.
Figure 13B:
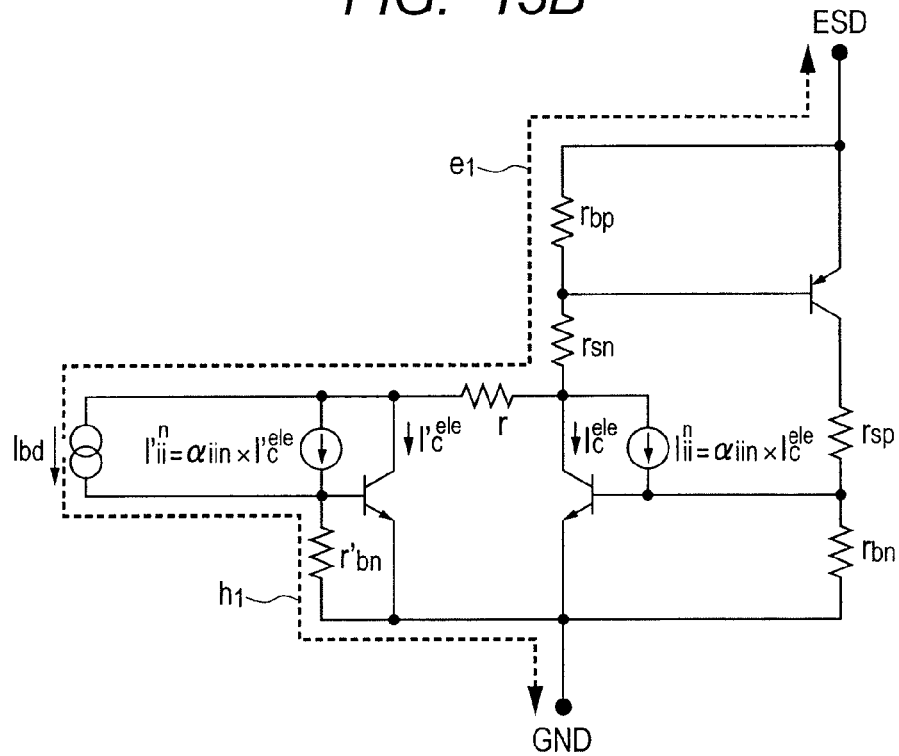

Next, referring to FIGS. 13A and 13B, FIG. 14 and FIG. 15, an operation of the protection device shown in FIG. 11 and FIG. 12 in a first operation mode is described below. When the first wiring 300 receives an abnormal voltage, electrical breakdown in the junction region between the second second-conductivity-type diffusion layer 140 and the first-conductivity-type layer 100 occurs not at the bottom surface but at the side face of the second second-conductivity-type diffusion layer 140 as shown in FIG. 13. The reason for this is the same as that in the first embodiment. Holes are generated as a result of the electrical breakdown and move as a hole current h1 toward the second-conductive-type high-concentration diffusion layer 142. On the other hand, electrons generated by the breakdown move as an electron flow e1 to the high-concentration diffusion layer 122 via the buried layer 110 and the first first-conductivity-type diffusion layer 120.

Figure 14:
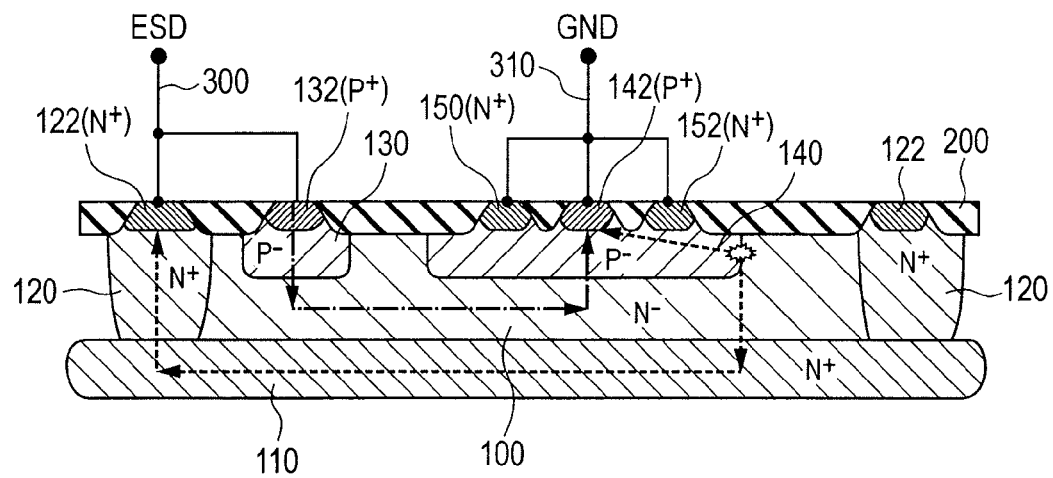
FIG. 14 is a cross-sectional view illustrating an operation of the protection device shown in FIG. 11 and FIG. 12 in a first operation mode.

As a result, as shown in FIG. 14, a diode formed by elements including the first second-conductivity-type diffusion layer 130 and the first-conductivity-type layer 100 turns on. As a result, a pnp bipolar transistor formed by elements including the first second-conductivity-type diffusion layer 130, the first-conductivity-type layer 100 and the second second-conductivity-type diffusion layer 140 starts to operate. As a result, a hole current, which is a current provided by holes serving as carries, flows between the first second-conductivity-type diffusion layer 130 and the second second-conductivity-type diffusion layer 140. The sequence of operation steps is similar to that according to the first embodiment.

Figure 15:
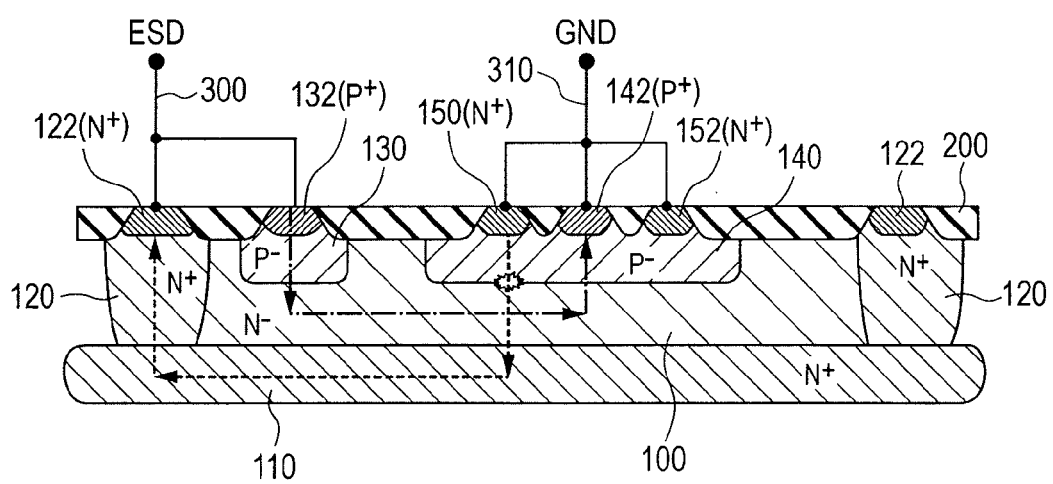
FIG. 15 is a cross-sectional view illustrating an operation of the protection device shown in FIG. 11 and FIG. 12 in a first operation mode.

As shown in FIG. 15, the start of flowing of the current through the second second-conductivity-type diffusion layer 140 leads to a start of the operation of a vertical-type npn bipolar transistor formed by elements including the second first-conductivity-type diffusion layer 150, the second second-conductivity-type diffusion layer 140, and the first-conductivity-type layer 100. In this way, the thyristor starts the operation. The sequence of operation steps is similar to that according to the first embodiment.

As described above with reference to FIG. 14, in the case where a voltage drop caused by a current (e1 in FIG. 13B) generated by breakdown makes a start of the operation of the diode formed by elements including the first second-conductivity-type diffusion layer 130 and the first-conductivity-type layer 100, the thyristor starts the operation via the process described above with reference to FIGS. 14 and 15. However, in a case where the electron flow e1 generated by the breakdown is not large enough to turn on the diode formed by elements including the first-conductivity-type layer 100 and the first second-conductivity-type diffusion layer 130, the operation of the thyristor is performed via a process in a second mode described below with reference to FIG. 16A, FIG. 16B, FIG. 17A, FIG. 17B, FIG. 18A, and FIG. 18B.

Figure 16A:
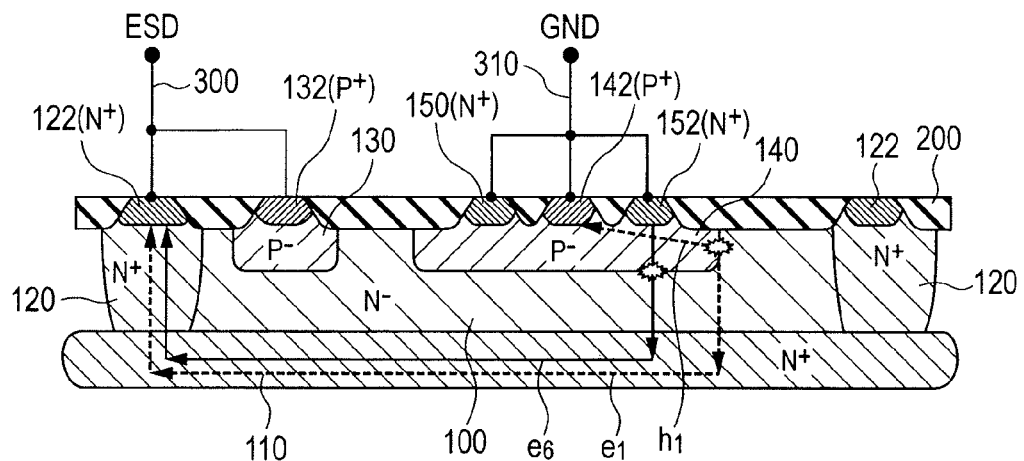
FIGS. 16A and 16B are a cross-sectional view and an equivalent circuit diagram illustrating an operation of the protection device shown in FIG. 11 and FIG. 12 in a second operation mode.
Figure 16B:
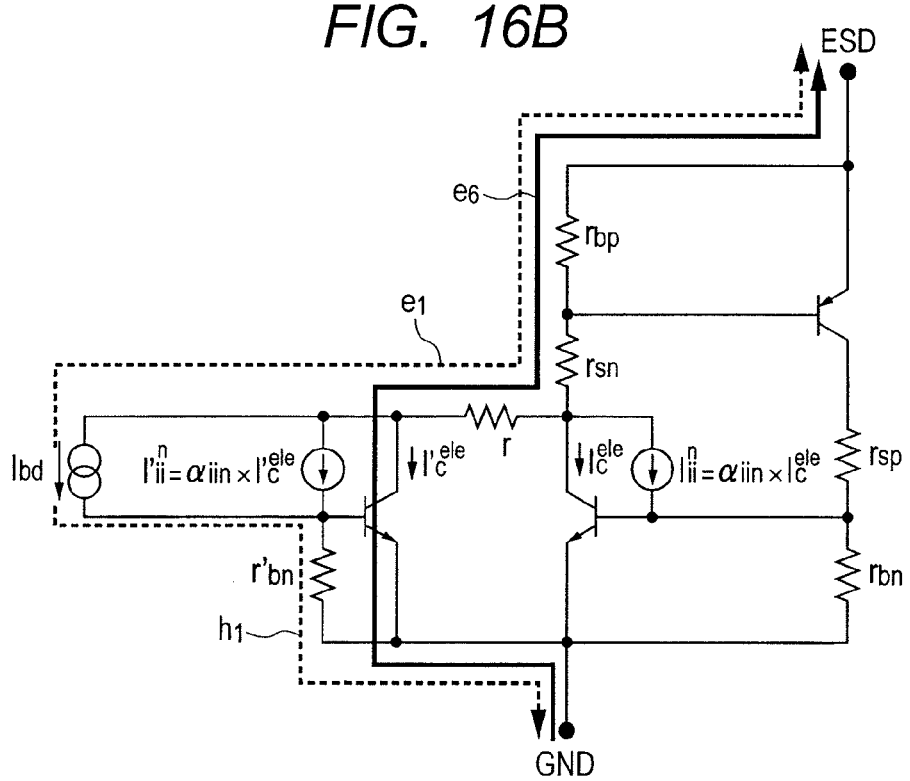

First, as shown in FIG. 16A and FIG. 16B, electrical breakdown occurs on a side face of the junction region between the second second-conductivity-type diffusion layer 140 and the first-conductivity-type layer 100 in a similar manner as shown in FIG. 13A. Holes generated by the electrical breakdown move as a hole current h1 toward the second-conductive-type high-concentration diffusion layer 142, while electrons generated by the electrical breakdown move as an electron flow e1 to the high-concentration diffusion layer 122 via the buried layer 110 and the first first-conductivity-type diffusion layer 120 shown on the left-hand side of FIG. 16A.

In the travel of the hole current h1 toward the second-conductive-type high-concentration diffusion layer 142, the hole current h1 passes through a resistor r'bn. This causes a voltage drop to occur across the resistor r'bn. As a result, the potential of the second second-conductivity-type diffusion layer 140 becomes higher, at a location immediately below the first-conductivity-type diffusion layer 152, than the GND potential. This causes the diode formed by elements including the first-conductivity-type diffusion layer 152 and the second second-conductivity-type diffusion layer 140 to turn on. This makes a start of the operation of the vertical-type npn bipolar transistor formed by elements including the first-conductivity-type diffusion layer 152, the second second-conductivity-type diffusion layer 140, and the first-conductivity-type layer 100, and thus an electron flow e6 starts to flow. Once the electron flow e6 starts to flow, the vertical-type npn bipolar transistor formed by elements including the first-conductivity-type diffusion layer 152, the second second-conductivity-type diffusion layer 140, and the first-conductivity-type layer 100 goes to the state shown in FIG. 17A in which the current can continuously flow even if there is no hole current h1 because a hole current h5 generated by impact ionization initiated by the electron flow e6 is supplied to base resistance r'bn. That is, an impact ionization current $I'_{ii}{}^n$ caused by a collector current $I'_c{}^{ele}$ (identical to e6) shown in FIGS. 17A and 17B flows through the base resistance r'bn, whereby an operation occurs in the npn bipolar transistor formed by elements including the first-conductivity-type diffusion layer 152, the second second-conductivity-type diffusion layer 140, and the first-conductivity-type layer 100. The impact ionization current $I'_{ii}{}^n$ (that flows as h5 in the second second-conductivity-type diffusion layer 140 shown in FIG. 17A) has a relationship described below with the collector current $I'_c{}^{ele}$.

$$I'_{ii}{}^n \alpha_{iin} \times I'_c{}^{ele}$$

where $\alpha_{iin}$ is a coefficient depending on the collector-base voltage and indicating a rate at which impact ionization occurs due to the current $I'_c{}^{ele}$. Note that an electron flow e7 generated by the impact ionization caused by the electron flow e6 flows together with the electron flow e6.

Figure 17A:
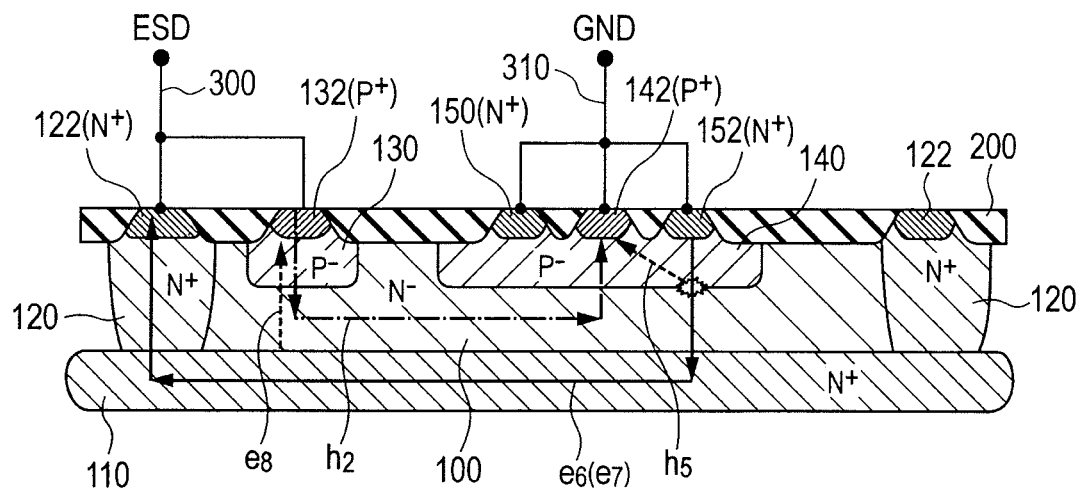
FIGS. 17A and 17B are a cross-sectional view and an equivalent circuit diagram illustrating an operation of the protection device shown in FIG. 11 and FIG. 12 in a second operation mode.
Figure 17B:
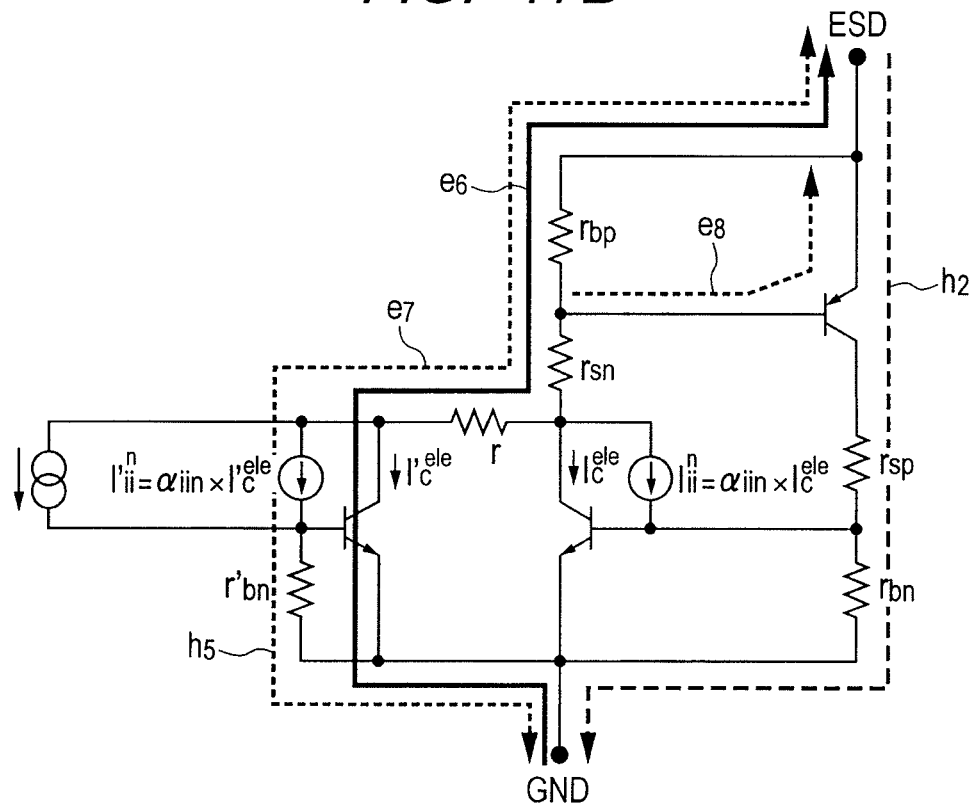

If the vertical-type npn bipolar transistor formed by elements including the first-conductivity-type diffusion layer 152, the second second-conductivity-type diffusion layer 140, and the first-conductivity-type layer 100 starts the operation, a current flows into the first first-conductivity-type diffusion layer 120 via the buried layer 110, which causes a voltage drop across a series of resistive components (rbp) including a part of the resistive component of the buried layer 110 from a location immediately below the first second-conductivity-type diffusion layer 130 to the first first-conductivity-type diffusion layer 120 on the left-hand side and the resistive component of the first first-conductivity-type diffusion layer 120 on the left-hand side in FIG. 17A. This voltage drop causes a reduction in potential of the first-conductivity-type layer 100 at a location near the first second-conductivity-type diffusion layer 130. As a result of this potential reduction, the potential of the first-conductivity-type layer 100 becomes lower than that of the first second-conductivity-type diffusion layer 130, in a region below the first second-conductivity-type diffusion layer 130 and an adjacent region to the right thereof. As a result, as shown in FIG. 17A, a diode formed by elements including the first second-conductivity-type diffusion layer 130 and the first-conductivity-type layer 100 turns on, which causes the pnp bipolar transistor formed by elements including the first second-conductivity-type diffusion layer 130, the first-conductivity-type layer 100, and the second second-conductivity-type diffusion layer 140 to start to operate, and thus a hole current h2 starts to flow. At the same time, a part of the electron flow e6 flows as an electron current e8 from the buried layer 110 into the first second-conductivity-type diffusion layer 130 via the first-conductivity-type layer 100.

Figure 18A:
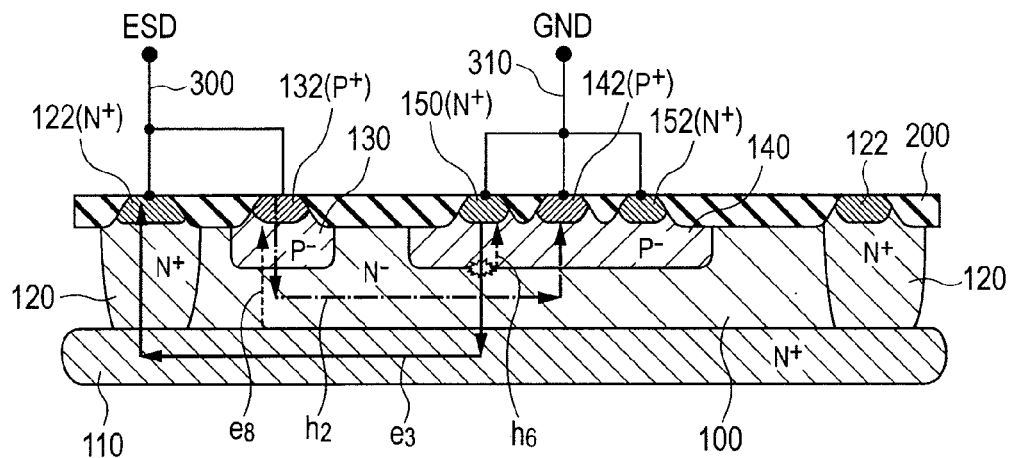
FIGS. 18A and 18B are a cross-sectional view and an equivalent circuit diagram illustrating an operation of the protection device shown in FIG. 11 and FIG. 12 in a second operation mode.
Figure 18B:
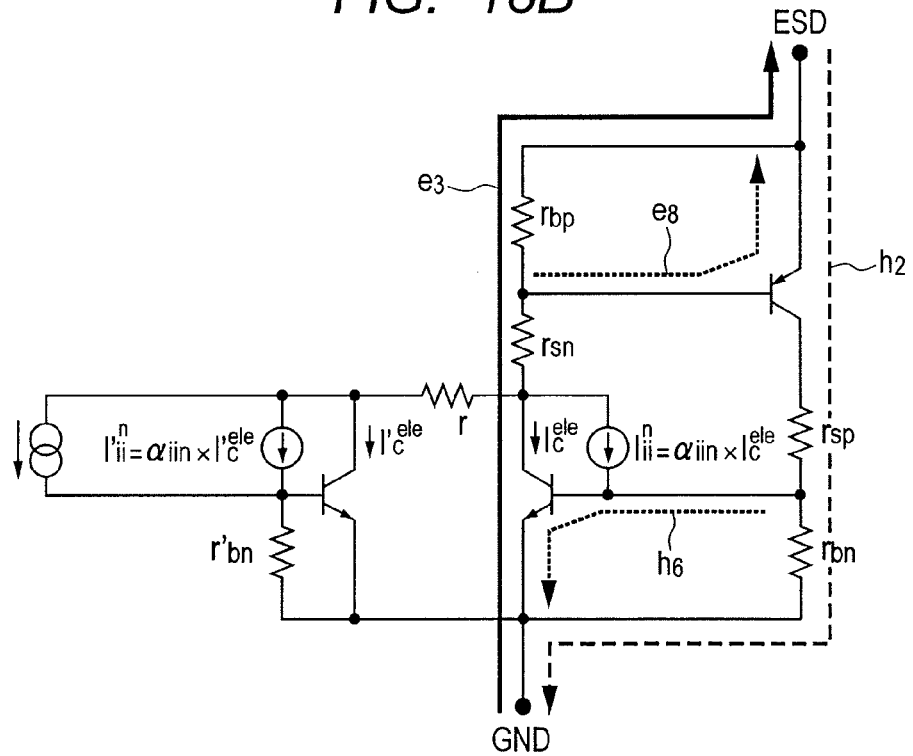

As shown in FIG. 18A, the hole current h2 flowing through the resistor rbn causes the potential of the second second-conductivity-type diffusion layer 140 to become higher than the ground potential, in a region immediately below the second first-conductivity-type diffusion layer 150. As a result, a diode formed by elements including the second first-conductivity-type diffusion layer 150 and the second second-conductivity-type diffusion layer 140 turns on, which causes the npn bipolar transistor formed by elements including the second first-conductivity-type diffusion layer 150, the second second-conductivity-type diffusion layer 140, and the first-conductivity-type layer 100 to start to operate, and thus an electron flow e3 starts to flow. At the same time, a part of the hole current h2 flows as a hole current h6 into the second first-conductivity-type diffusion layer 150 from the first-conductivity-type layer 100 via the second second-conductivity-type diffusion layer 140. Note that both the npn bipolar transistor formed by elements including the second first-conductivity-type diffusion layer 150, the second second-conductivity-type diffusion layer 140, and the first-conductivity-type layer 100 and the npn bipolar transistor formed by elements including the first-conductivity-type diffusion layer 152, the second second-conductivity-type diffusion layer 140, and the first-conductivity-type layer 100 operate simultaneously.

However, the hole current h2 flowing through the resistor rbn causes the potential of the base of the npn bipolar transistor formed by elements including the second first-conductivity-type diffusion layer 150, the second second-conductivity-type diffusion layer 140, and the first-conductivity-type layer 100 to become higher than the potential of the base of the bipolar transistor formed by elements including the first-conductivity-type diffusion layer 152, the second second-conductivity-type diffusion layer 140, and the first-conductivity-type layer 100. Both the bipolar transistor formed by elements including the second first-conductivity-type diffusion layer 150, the second second-conductivity-type diffusion layer 140, and the first-conductivity-type layer 100 and the bipolar transistor formed by elements including the first-conductivity-type diffusion layer 152, the second second-conductivity-type diffusion layer 140, and the first-conductivity-type layer 100 are designed to operate such that electrons are injected from the emitter into a high electric field in the depletion layer in the junction between the collector (first-conductivity-type layer 100) and the base (second second-conductivity-type diffusion layer 140) whereby a hole current is generated by impact ionization and the potential of the base is increased by the hole current to a level higher than the GND potential thereby switching the transistor into the active state. In the operation of the npn bipolar transistor formed by elements including the second first-conductivity-type diffusion layer 150, the second second-conductivity-type diffusion layer 140, and the first-conductivity-type layer 100 has the hole current h2 provided from the pnp bipolar transistor in addition to the hole current (not shown in FIG. 18A but corresponding to $I_{ii}''$ shown in FIG. 18B) generated by impact ionization caused by e3, and thus this npn bipolar transistor can properly operate even when the hole current generated by the impact ionization is smaller than the hole current required in the npn bipolar transistor formed by elements including the first-conductivity-type diffusion layer 152, the second second-conductivity-type diffusion layer 140, and the first-conductivity-type layer 100. Therefore, impact ionization can be generated to a sufficiently high degree by smaller electric field intensity in the depletion layer than is required when no hole current h2 is available. Thus, the voltage of the collector (first-conductivity-type layer 100) is also allowed to be small. Therefore, the voltage applied between the ESD and GND terminals drops to a level that allows the npn bipolar transistor formed by elements including the second first-conductivity-type diffusion layer 150, the second second-conductivity-type diffusion layer 140, and the first-conductivity-type layer 100 That is, the bipolar transistor formed by elements including the first-conductivity-type diffusion layer 150, the second second-conductivity-type diffusion layer 140, and the first-conductivity-type layer 100 is capable of passing a particular amount of current with a smaller voltage than is needed by the bipolar transistor formed by elements including the first-conductivity-type diffusion layer 152, the second second-conductivity-type diffusion layer 140, and the first-conductivity-type layer 100. Therefore, when a current is injected by ESD, almost all of it passes through the bipolar transistor formed by elements including the first-conductivity-type diffusion layer 150, the second second-conductivity-type diffusion layer, 140, and the first-conductivity-type layer 100. The voltage necessary in this situation is smaller than is needed to pass the current through the bipolar transistor formed by elements including the first-conductivity-type diffusion layer 152, the second second-conductivity-type diffusion layer 140, and the first-conductivity-type layer 100, and thus a reduction in voltage occurs. As a result of the reduction in voltage, the operation of the npn bipolar transistor formed by elements including the second first-conductivity-type diffusion layer 152, the second second-conductivity-type diffusion layer 140, and the first-conductivity-type layer 100 stops, and only the npn bipolar transistor formed by elements including the second first-conductivity-type diffusion layer 150, the second second-conductivity-type diffusion layer 140, and the first-conductivity-type layer 100 continues to operate. As a result, the thyristor operates in a state in which the thyristor is formed by the npn bipolar transistor formed by elements including the second first-conductivity-type diffusion layer 150, the second second-conductivity-type diffusion layer 140, and the first-conductivity-type layer 100 and the pnp bipolar transistor formed by elements including the first second-conductivity-type diffusion layer 130, the first-conductivity-type layer 100, and the second second-conductivity-type diffusion layer 140.

In the present embodiment, as in the first embodiment, the breakdown voltage can be set to an arbitrary value independently of the holding voltage, because, as shown in the cross-sectional view with the equivalent circuit diagram shown in FIG. 30, the element that supplies the breakdown current Idb is disposed at a location off the current path in the thyristor operation. The hold current is determined in a similar manner to the manner in which the holding voltage is determined in the first embodiment described above with reference to FIGS. 6A, 6B, 7, and 8. Note that to apply the explanation on the holding voltage in the thyristor operation in the first embodiment to the second embodiment, the npn bipolar transistor and the pnp bipolar transistor should be read as counterparts in the second embodiment. More specifically, in the second embodiment, the npn bipolar transistor is formed by elements including the first-conductivity-type diffusion layer 150, the second second-conductivity-type diffusion layer 140, and the first-conductivity-type layer 100, while the pnp bipolar transistor is formed by elements including the first second-conductivity-type diffusion layer 130, the first-conductivity-type layer 100, and the second second-conductivity-type diffusion layer 140.

Furthermore, as described above, in the operation of the thyristor according to the present embodiment, unlike the ordinary thyristors, the operation of the npn bipolar transistor is not perfectly based on the feedback from the pnp bipolar transistor, and thus the operation is not of a 100% thyristor operation but of a partial thyristor operation. In the present invention, such a partial thyristor operation is regarded as a thyristor operation.

In the explanation given above as to the operation of, for example, the bipolar transistor formed by elements including the first-conductivity-type diffusion layer 150, the second second-conductivity-type diffusion layer 140, and the first-conductivity-type layer 100, it is assumed that the operation occurs such that a depletion layer is created in or close to the junction between the second second-conductivity-type diffusion layer 140 (base) and the first-conductivity-type layer 100 (collector) and an electron current is injected into the depletion layer from the first-conductivity-type diffusion layer 150 (emitter) whereby impact ionization occurs. However, in practice, the depletion layer is not always located in a limited region near the junction, but the depletion layer can extend to a point close to the boundary between the high-concentration buried layer 110 and the low-concentration first-conductivity-type layer 100 (collector).

It has also been assumed that in the structure according to the second embodiment described above with reference to FIG. 30 or in the structure according to any other embodiment, the ESD protection device is coupled to the ESD terminal and the GND terminal. However, the ESD protection device does not necessarily need to be coupled to the GND terminal and the ESD protection device does not necessarily need to be coupled to the ESD terminal as long as the two terminals of the ESD protection device are coupled to a path of an ESD current. For example, in a case where a current is passed from a terminal A to a terminal B via the ESD protection device, the ESD terminal shown in FIG. 30 may be coupled to the terminal and the GND terminal shown in FIG. 30 may be coupled to the terminal B.

Figure 31:
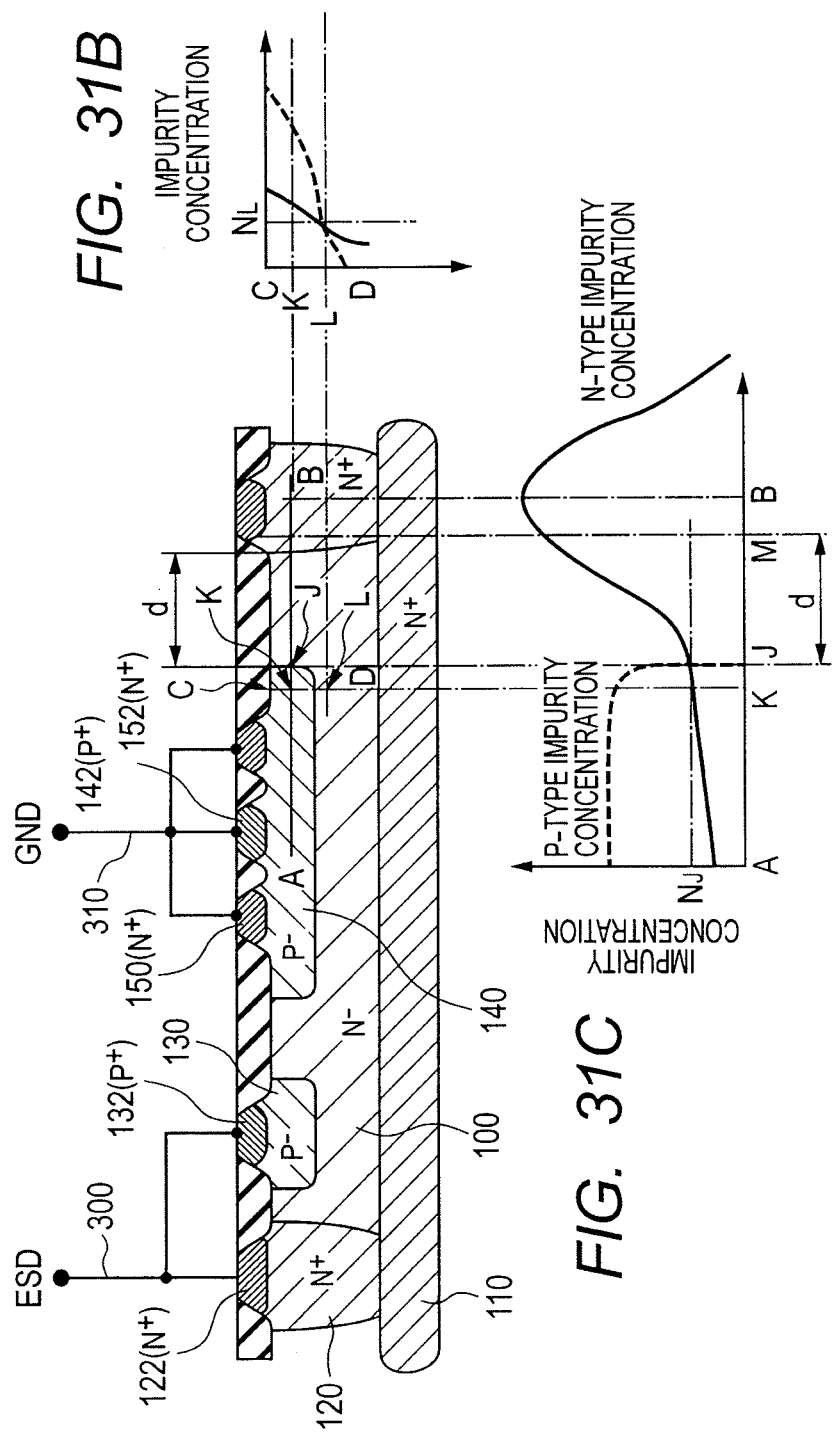
FIGS. 31A, 31B, and 31C are diagrams illustrating a manner in which a triggering voltage of the semiconductor device shown in FIG. 11 is adjusted.

Referring to FIGS. 31A and 31B similar to FIGS. 9A and 9B used in the description of the first embodiment, a method of adjusting the triggering voltage of the semiconductor device shown in FIG. 11 is described below. As can be seen from FIGS. 31A and 31B, also in the present embodiment, the triggering voltage of the thyristor can be adjusted by adjusting the distance d between the second second-conductivity-type diffusion layer 140 and the first-conductivity-type high-concentration diffusion layer 122 on the right-hand of FIG. 31A.

In the present embodiment, in a case where a structure shown in FIG. 28 is employed, the triggering voltage of the thyristor can be adjusted by adjusting a distance d' from the second-conductivity-type high-concentration diffusion layer 142 to the first-conductivity-type high-concentration diffusion layer 122.

The present invention provides advantages similar to those provided by the first embodiment. The thyristor can start the operation via a process in either one of two operation modes. In the second operation mode, after the npn bipolar transistor starts to operate, the pnp bipolar transistor turns on. The npn bipolar transistor can easily turn on compared with the pnp bipolar transistor, which reduces the probability that the thyristor does not turn on.

Third Embodiment

Figure 19:
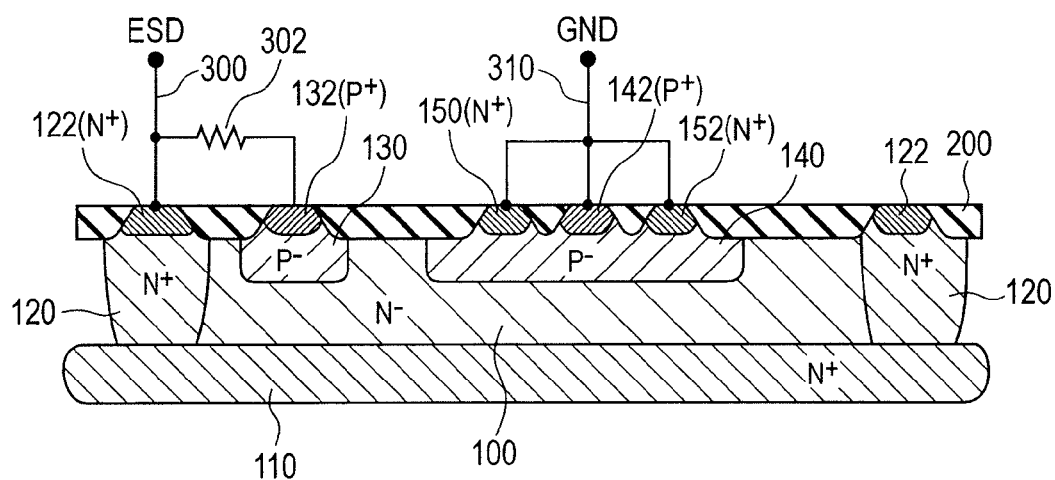
FIG. 19 is a cross-sectional view illustrating a structure of a semiconductor device according to a third embodiment of the present invention.

FIG. 19 is a cross-sectional view illustrating a structure of a semiconductor device according to a third embodiment of the present invention. The semiconductor device according to the present embodiment is similar in configuration to the semiconductor device according to the second embodiment except that the first wiring 300 has a resistor element 302.

The first wiring 300 has a node at which the first wiring 300 is split into two branches, one of which extends to the high-concentration diffusion layer 132 and the other one of which extends to the high-concentration diffusion layer 122. The resistor element 302 is disposed between this node and the first second-conductivity-type diffusion layer 130. That is, the resistor element 302 is directly coupled to the high-concentration diffusion layer 132 but it is not directly coupled to the high-concentration diffusion layer 122.

The present invention provides advantages similar to those provided by the second embodiment. The provision of the resistor element 302 makes it possible to limit the current split from the abnormal current on the first wiring 300 into the first second-conductivity-type diffusion layer 130. This limits the operation of the bipolar transistor formed by elements including the first second-conductivity-type diffusion layer 130, the first-conductivity-type layer 100, and the second second-conductivity-type diffusion layer 140, and thus it becomes possible to increase the holding voltage of the thyristor.

A resistor element similar to the resistor element 302 according to the present embodiment may be employed in the first embodiment described above. In this case, in addition to the above-described advantages provided by the first embodiment, the advantage provided by the provision of the resistor element 302 is also achieved.

Fourth Embodiment

Figure 20:
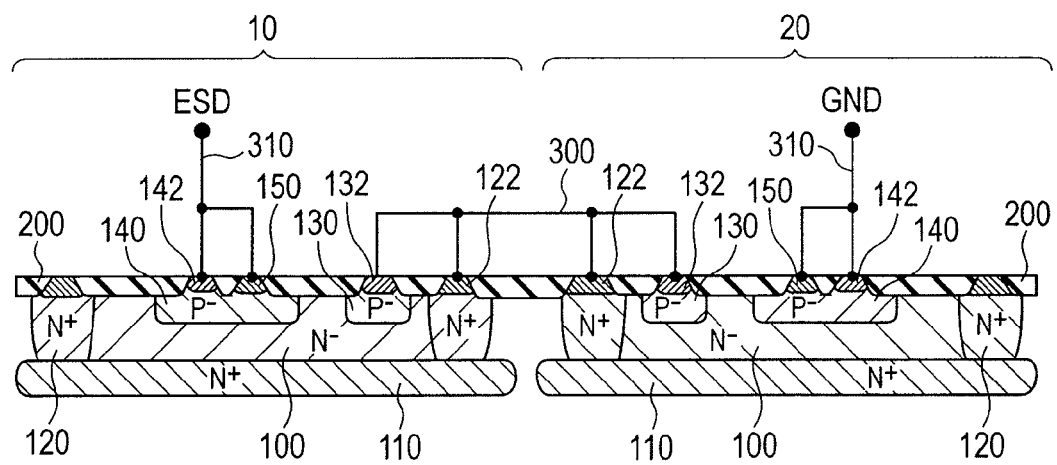
FIG. 20 is a cross-sectional view illustrating a structure of a semiconductor device according to a fourth embodiment of the present invention.

FIG. 20 is a cross-sectional view illustrating a structure of a semiconductor device according to a fourth embodiment of the present invention. The semiconductor device according to the present embodiment is similar to that according to the first embodiment except for the followings.

First, the semiconductor device includes two protection devices (protection devices 10 and 20) each including a first-conductivity-type layer 100, a buried layer 110, a first first-conductivity-type diffusion layer 120, a first second-conductivity-type diffusion layer 130, a second second-conductivity-type diffusion layer 140, and a second first-conductivity-type diffusion layer 150. In these two protection devices 10 and 20 the high-concentration diffusion layers 122 and the high-concentration diffusion layers 132 are coupled together via the first wiring 300. The second wiring 310 of the protection device 10 is coupled to a wiring that has a possibility of receiving an abnormal voltage, while the second wiring 310 of the protection device 20 is coupled to the grand wiring. In the two protection devices 10 and 20, any diffusion layer and any buried layer are not coupled to any other diffusion layer or buried layer.

Figure 21A:
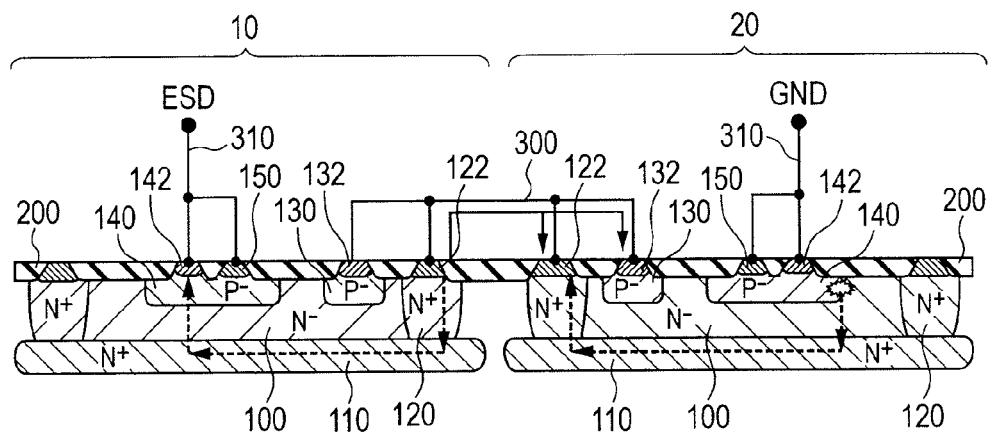
FIGS. 21A and 21B are cross-sectional views illustrating an operation of the protection device shown in FIG. 20.

Referring to cross-sectional views shown in FIGS. 21A and 21B and FIG. 22, the operation of the protection device shown in FIG. 20 is described below. First, referring to FIG. 21A, when the second wiring 310 of the protection device 10 receives an abnormal voltage, this voltage functions as a forward voltage applied to a diode formed by elements including the second second-conductivity-type diffusion layer 140 and the first-conductivity-type layer 100 in the protection device 10. As a result, this voltage is applied to the a junction between the second second-conductivity-type diffusion layer 140 and the first-conductivity-type layer 100 in the protection device 20 via the first-conductivity-type layer 100, the buried layer 110, the first first-conductivity-type diffusion layer 120, and the first wiring 300 in the protection device 10 and via the first first-conductivity-type diffusion layer 120, the buried layer 110, and the buried layer 110 in the protection device 20. As a result, the protection device 20 has a breakdown at a side face of the second second-conductivity-type diffusion layer 140 in a similar manner as in the first embodiment described above with reference to FIGS. 4A and 4B. An electron current generated by the breakdown flows to the second wiring 310 of the protection device 10 via the first-conductivity-type layer 100, the buried layer 110, the first first-conductivity-type diffusion layer 120, and the first wiring 300 in the protection device 10 and via the first first-conductivity-type diffusion layer 120, the buried layer 110, the first-conductivity-type layer 100 and the second second-conductivity-type diffusion layer 140.

Figure 21B:
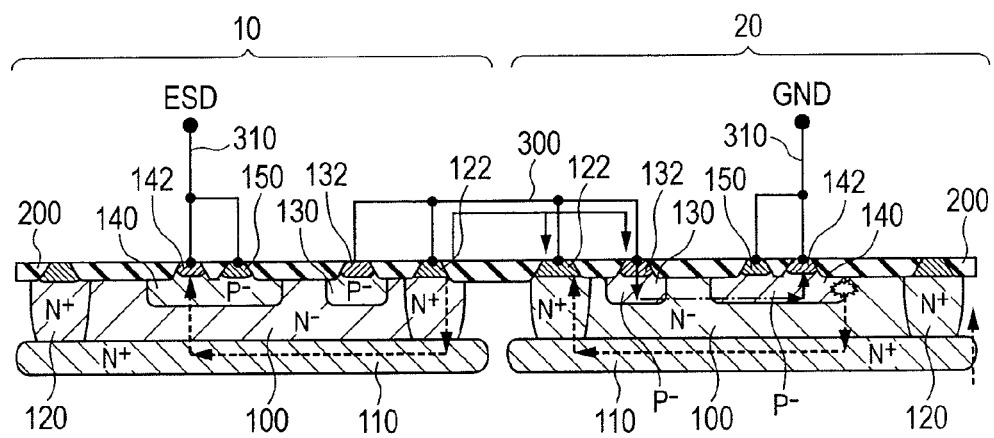

In response, as shown in FIG. 21B, the diode formed by elements including the first second-conductivity-type diffusion layer 130 and the first-conductivity-type layer 100 in the protection device 20 turns on in a similar manner as in the first embodiment described above with reference to FIGS. 5A and 5B. As a result, the pnp bipolar transistor formed by elements including the first second-conductivity-type diffusion layer 130, the first-conductivity-type layer 100, and the second second-conductivity-type diffusion layer 140 starts to operate, and thus a hole current, which is a current provided by holes serving as carries, flows between the first second-conductivity-type diffusion layer 130 and the second second-conductivity-type diffusion layer 140.

Figure 22:
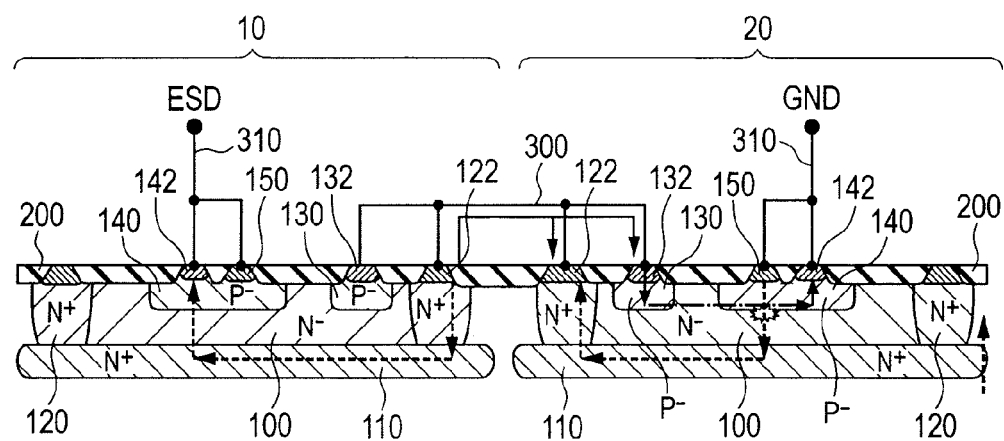
FIG. 22 is an equivalent circuit diagram illustrating an operation of the protection device shown in FIG. 20.

Thus, as shown in FIG. 22, the current starts to flow through the second second-conductivity-type diffusion layer 140, and thus, in the protection device 20, the vertical-type npn bipolar transistor formed by elements including the second first-conductivity-type diffusion layer 150, the second second-conductivity-type diffusion layer 140, and the first-conductivity-type layer 100 starts to operate in a similar manner as in the first embodiment described above with reference to FIGS. 6A and 6B. The current that passes through the npn bipolar transistor flows into the first wiring 300 and further into second wiring 310 of the protection device 10 via the first first-conductivity-type diffusion layer 120, the buried layer 110, the first-conductivity-type layer 100, and the second second-conductivity-type diffusion layer 140 in the protection device 10. In this way, the thyristor of the protection device 20 starts the operation whereby the abnormal voltage is discharged to the ground wiring.

In a case where the ground wiring of the semiconductor device shown in FIG. 20 receives an abnormal voltage, the operation is performed in a similar manner as described above with reference to FIG. 21A, FIG. 21B, and FIG. 22 except that the operation process proceeds in a reverse direction in the protection devices 10 and 20. That is, in this case, the thyristor of the protection device 10 operates whereby the abnormal voltage applied to the ground wiring is discharged to a wiring (not shown) coupled to the second wiring 310 of the protection device 10.

In the present embodiment, the protection devices 10 and 20 may be configured in a similar manner to the protection device according to the second or third embodiment.

The present invention provides advantages similar to those provided by the first embodiment. Besides, the protection is provided for both voltage polarities and for both directions.

Fifth Embodiment

Figure 23:
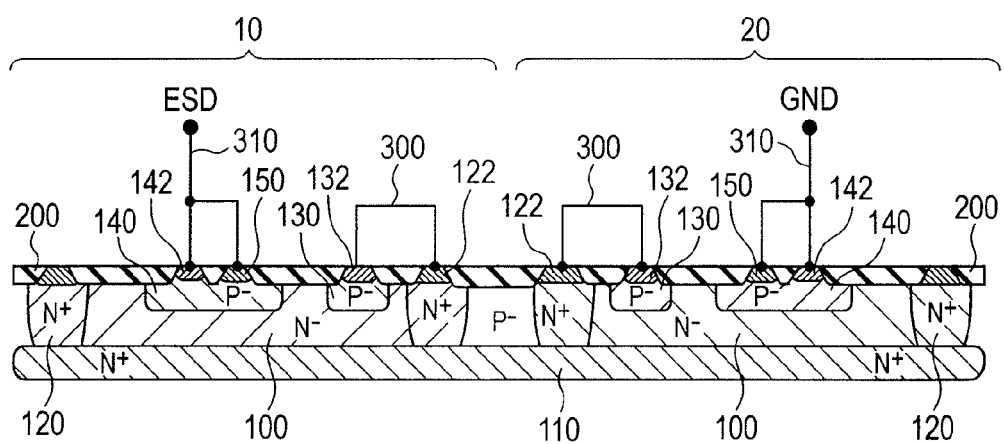
FIG. 23 is a cross-sectional view illustrating a structure of a semiconductor device according to a fifth embodiment of the present invention.
Figure 32:
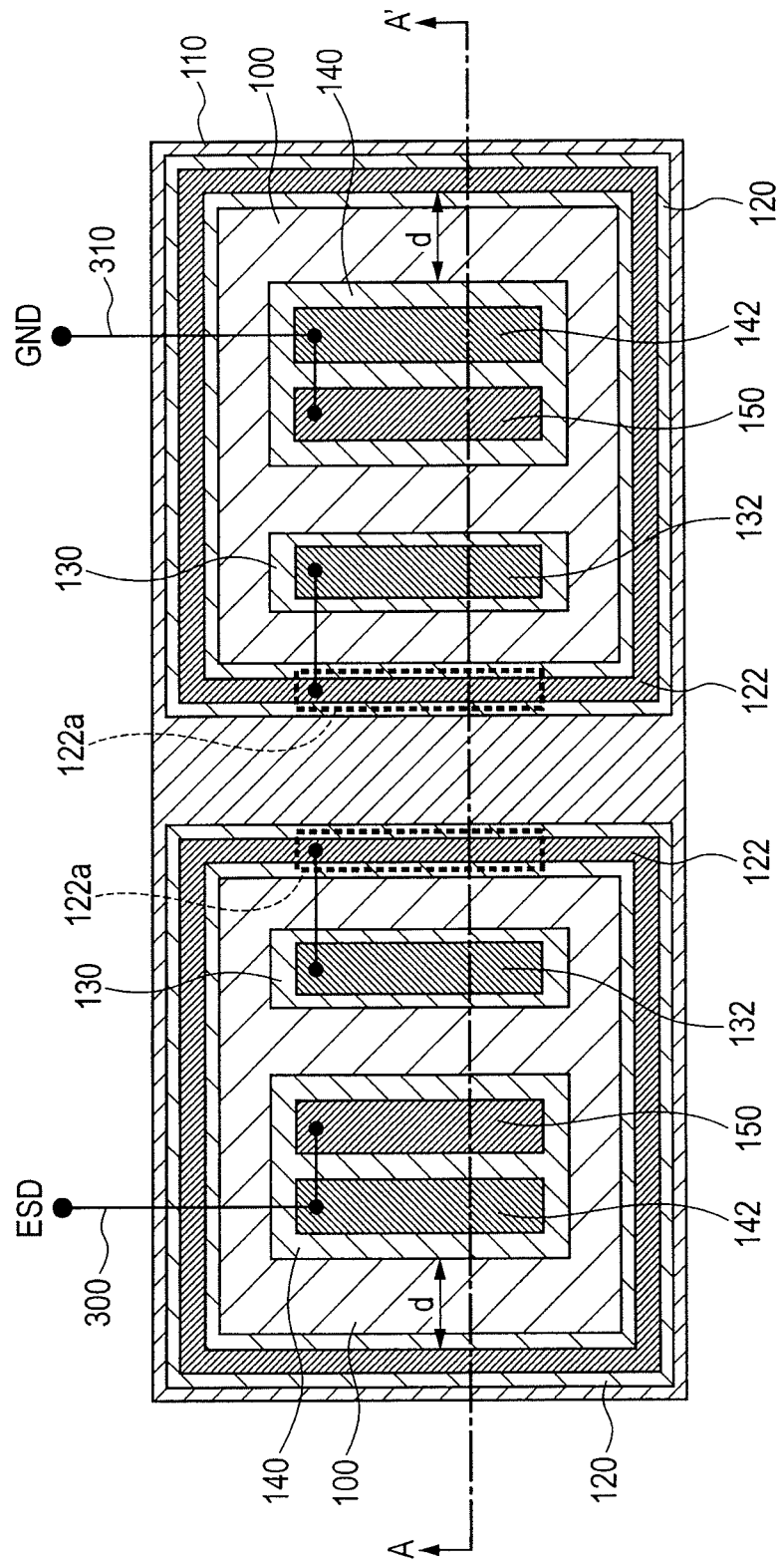
FIG. 32 is a plan view of the semiconductor device shown in FIG. 23.

FIG. 23 is a cross-sectional view illustrating a structure of a semiconductor device according to a fifth embodiment of the present invention. FIG. 32 is a plan view of the semiconductor device shown in FIG. 23. FIG. 23 is a cross-sectional view taken along line A-A' of FIG. 32. The semiconductor device according to the present embodiment is similar to that according to the fourth embodiment except for the followings.

The buried layers 110 of the protection devices 10 and 20 are coupled to each other, while the first wirings 300 of the protection devices 10 and 20 are separate from each other.

Figure 24A:
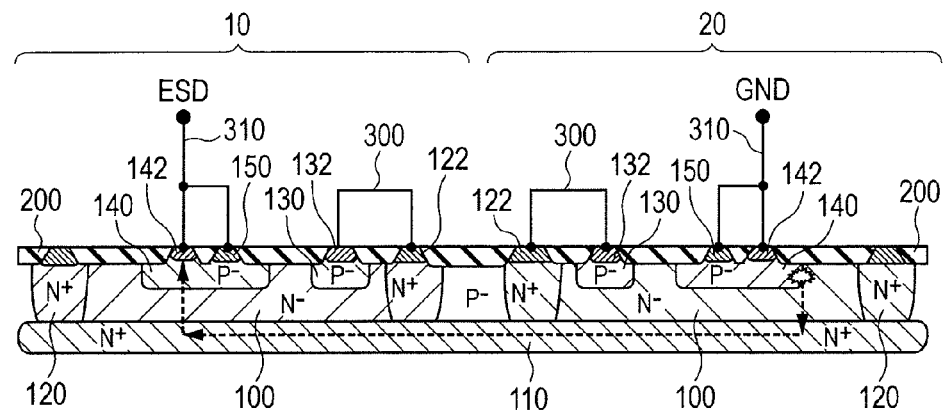
FIGS. 24A and 24B are cross-sectional views illustrating an operation of the protection device shown in FIG. 23.

Referring to cross-sectional views shown in FIG. 24A, FIG. 24B, and FIG. 25, the operation of the protection device shown in FIG. 23 is described below. First, referring to FIG. 24A, when the second wiring 310 of the protection device 10 receives an abnormal voltage, this voltage functions as a forward voltage applied to a diode formed by elements including the second second-conductivity-type diffusion layer 140 and the first-conductivity-type layer 100 in the protection device 10. As a result, this voltage is applied to the a junction between the second second-conductivity-type diffusion layer 140 and the first-conductivity-type layer 100 in the protection device 20 via the first-conductivity-type layer 100, the buried layer 110, and the first-conductivity-type layer 100 in the protection device 20. As a result, the protection device 20 has a breakdown at a side face of the second second-conductivity-type diffusion layer 140 in a similar manner as in the first embodiment described above with reference to FIGS. 4A and 4B. An electron current generated by the breakdown flows to the second wiring 310 of the protection device 10 via the first-conductivity-type layer 100, the buried layer 110, and the second second-conductivity-type diffusion layer 140 in the protection device 10.

Figure 24B:
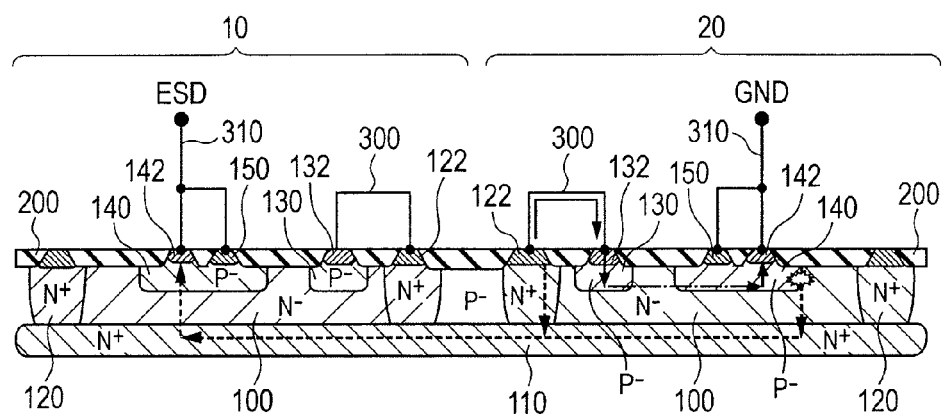

In response, as shown in FIG. 24B, the diode formed by elements including the first second-conductivity-type diffusion layer 130 and the first-conductivity-type layer 100 in the protection device 20 turns on in a similar manner as in the first embodiment described above with reference to FIGS. 5A and 5B. As a result, the pnp bipolar transistor formed by elements including the first second-conductivity-type diffusion layer 130, the first-conductivity-type layer 100, and the second second-conductivity-type diffusion layer 140 starts to operate, and thus a hole current, which is a current provided by holes serving as carries, flows between the first second-conductivity-type diffusion layer 130 and the second second-conductivity-type diffusion layer 140.

Figure 25:
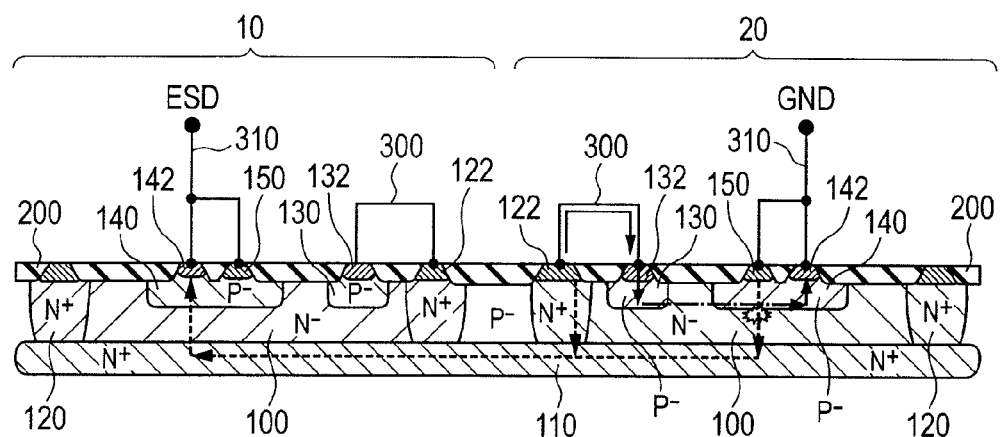
FIG. 25 is a cross-sectional view illustrating an operation of the protection device shown in FIG. 23.

Thus, as shown in FIG. 25, the current starts to flow through the second second-conductivity-type diffusion layer 140, and thus the vertical-type npn bipolar transistor formed by elements including the second first-conductivity-type diffusion layer 150, the second second-conductivity-type diffusion layer 140, and the first-conductivity-type layer 100 starts to operate in a similar manner as in the first embodiment described above with reference to FIGS. 6A and 6B. The current that has passed through the npn bipolar transistor flows into the buried layer 110 and further into second wiring 310 of the protection device 10 via the first-conductivity-type layer 100 and the second second-conductivity-type diffusion layer 140 in the protection device 10. In this way, the thyristor starts the operation whereby the abnormal voltage is discharged to the ground wiring.

In a case where the ground wiring of the semiconductor device shown in FIG. 23 receives an abnormal voltage, the operation is performed in a similar manner as described above with reference to FIG. 24A, FIG. 24B, and FIG. 25 except that the operation process proceeds in a reverse direction in the protection devices 10 and 20 whereby the abnormal voltage applied to the ground wiring is discharged to a wiring (not shown) coupled to the second wiring 310 of the protection device 10.

In the present embodiment, the protection devices 10 and 20 may be configured in a similar manner to the protection device according to the second or third embodiment.

The present invention provides advantages similar to those provided by the first embodiment. Besides, the protection is provided for both voltage polarities and for both directions.

Sixth Embodiment

Figure 26:
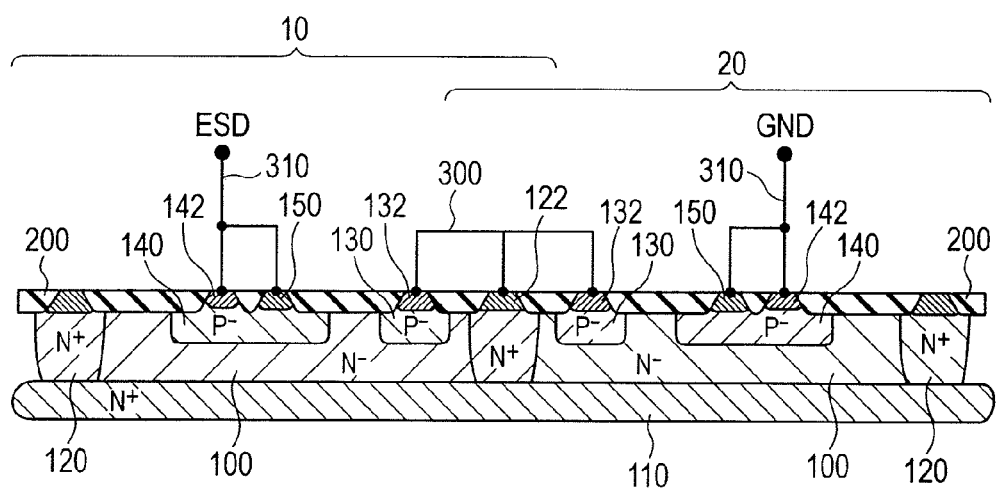
FIG. 26 is a cross-sectional view illustrating a structure of a semiconductor device according to a sixth embodiment of the present invention.
Figure 33:
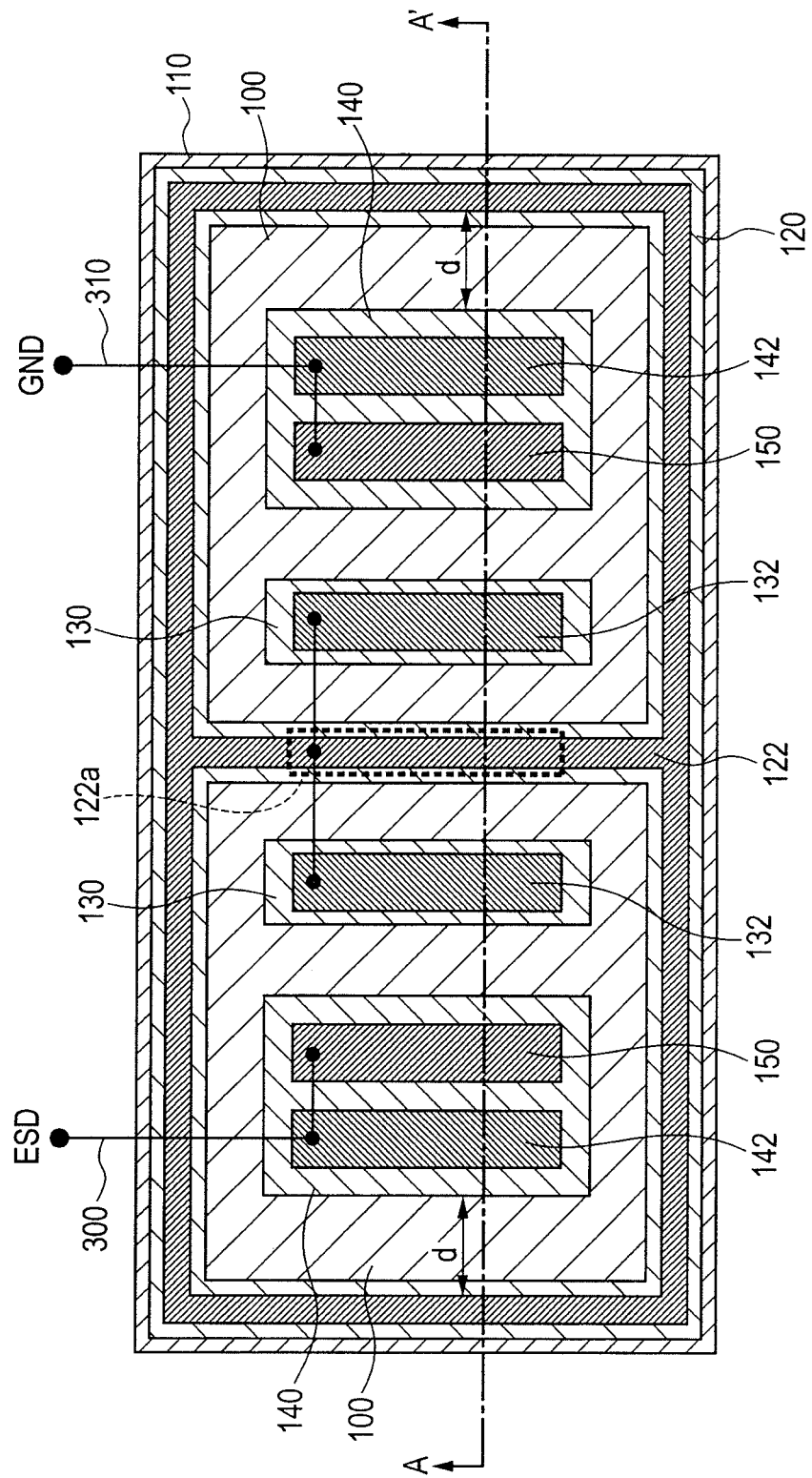
FIG. 33 is a plan view of the semiconductor device shown in FIG. 26.

FIG. 26 is a cross-sectional view illustrating a structure of a semiconductor device according to a sixth embodiment of the present invention. FIG. 33 is a plan view of the semiconductor device shown in FIG. 26. FIG. 26 is a cross-sectional view taken along line A-A' of FIG. 33. The semiconductor device according to the present embodiment is similar to that according to the fourth embodiment except that the protection devices 10 and 20 share the first first-conductivity-type diffusion layer 120 in a part located between the protection devices 10 and 20.

The present invention provides advantages similar to those provided by the fourth embodiment. Besides, because the protection devices 10 and 20 share the first first-conductivity-type diffusion layer 120 in the part located between the protection devices 10 and 20, it is possible to reduce the total size, in plan view, of the protection devices.

Seventh Embodiment

Figure 27:
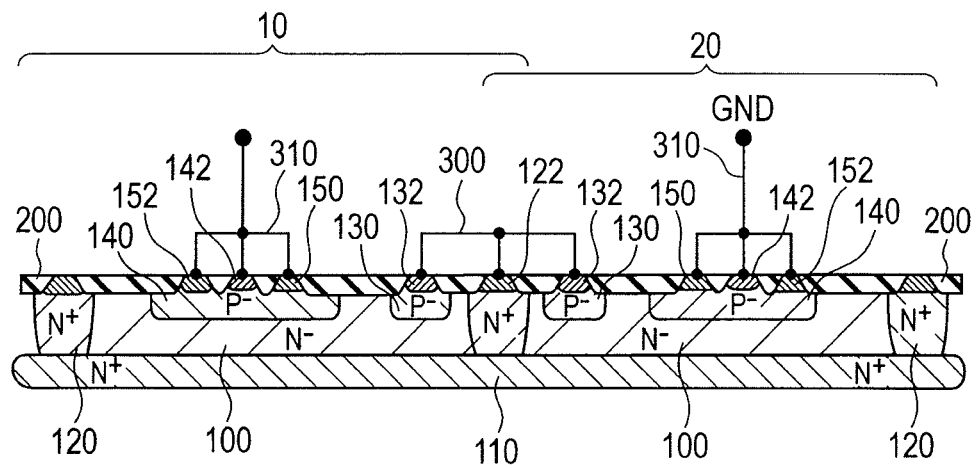
FIG. 27 is a cross-sectional view illustrating a structure of a semiconductor device according to a seventh embodiment of the present invention.
Figure 34:
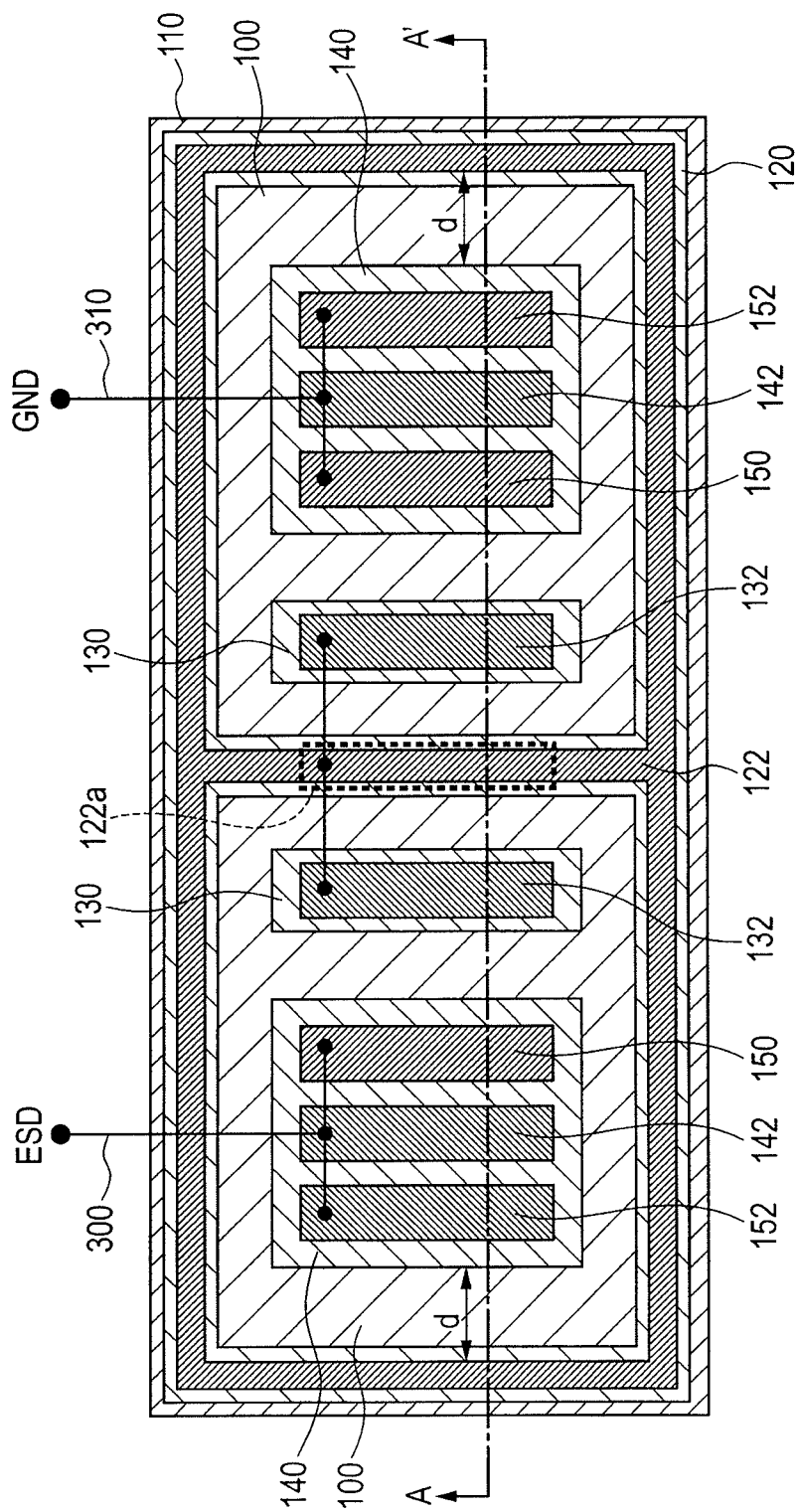
FIG. 34 is a plan view of the semiconductor device shown in FIG. 27.

FIG. 27 is a cross-sectional view illustrating a structure of a semiconductor device according to a seventh embodiment of the present invention. FIG. 34 is a plan view of the semiconductor device shown in FIG. 27. FIG. 27 is a cross-sectional view taken along line A-A' of FIG. 34. The semiconductor device according to the present embodiment is similar to that according to the sixth embodiment except that the protection devices 10 and 20 are configured in a similar manner to the protection device according to the second embodiment.

The present invention provides advantages similar to those provided by the first embodiment. Because the protection devices 10 and 20 have a structure similar to that according to the second embodiment, the thyristors of the protection devices 10 and 20 can start to operate via a process in either one of two operation modes as described above in the second embodiment, which reduces the probability that the thyristor does not turn on.

Embodiments of the present invention have been described above with reference to the drawings and they are only examples. However, many constitutions other than the above may also be applied to this invention.

What is claimed is:

1. A semiconductor device comprising:
a first-conductivity-type layer;
a first-conductivity-type buried layer whose upper surface is in contact with the first-conductivity-type layer and whose impurity concentration is higher than the impurity concentration of the first-conductivity-type layer;
a first first-conductivity-type diffusion layer which is in contact with the first-conductivity-type layer and whose bottom part is in contact with the buried layer;
a first second-conductivity-type diffusion layer formed in the first-conductivity-type layer such that a bottom part of the first second-conductivity-type diffusion layer is not in contact with the buried layer;
a second second-conductivity-type diffusion layer formed in the first-conductivity-type layer such that a bottom part of the second second-conductivity-type diffusion layer is not in contact with the buried layer and such that a side face of the second second-conductivity-type diffusion layer is at least partially in contact with the first-conductivity-type layer;
a second first-conductivity-type diffusion layer formed in the second second-conductivity-type diffusion layer such that the second first-conductivity-type diffusion layer is shallower than the second second-conductivity-type diffusion layer is;
a first wiring coupled to a first first-conductivity-type high-concentration diffusion layer formed in a surface region of the first first-conductivity-type diffusion layer and coupled to a first second-conductive-type high-concentration diffusion layer formed in a surface region of the first second-conductivity-type diffusion layer; and
a second wiring coupled to the second first-conductivity-type diffusion layer and a second second-conductive-type high-concentration diffusion layer formed in a surface region of the second second-conductivity-type diffusion layer;
wherein the first first-conductivity-type high-concentration diffusion layer includes a region in which there is a contact coupled thereto;
wherein the region in which there is the contact, the first second-conductivity-type diffusion layer, the second first-conductivity-type diffusion layer, and the second second-conductivity-type diffusion layer 140 are arranged in this order as viewed in plan view, and
wherein in a region in which the second second-conductivity-type diffusion layer and the first-conductivity-type layer are in contact with each other, impurity concentrations of the second second-conductivity-type diffusion layer and the first-conductivity-type layer are higher in a part at a side face of the second second-conductivity-type diffusion layer than in a part at a bottom surface.

2. The semiconductor device according to claim 1, wherein the first first-conductivity-type diffusion layer surrounds the first second-conductivity-type diffusion layer, the second first-conductivity-type diffusion layer, and the second second-conductivity-type diffusion layer.

3. The semiconductor device according to claim 1, further comprising:
an element isolation film,
wherein the second second-conductivity-type diffusion layer is deeper than the element isolation film is.

4. The semiconductor device according to claim 1, further comprising:

a third first-conductivity-type diffusion layer formed in the second second-conductivity-type diffusion layer such that the third first-conductivity-type diffusion layer is disposed at a location opposing the second first-conductivity-type diffusion layer via the second second-conductive-type high-concentration diffusion layer, wherein the second wiring is also coupled to the third first-conductivity-type diffusion layer.

5. The semiconductor device according to claim 1, wherein the first wiring includes a resistor element coupled to the first second-conductive-type high-concentration diffusion layer.

6. The semiconductor device according to claim 1, wherein two protection devices are formed each of which includes the first-conductivity-type layer, the buried layer, the first first-conductivity-type diffusion layer, the first second-conductivity-type diffusion layer, the second second-conductivity-type diffusion layer, and the second first-conductivity-type diffusion layer, and wherein the two protection devices are coupled to the first first-conductivity-type high-concentration diffusion layer via the first wiring.

7. The semiconductor device according to claim 1, wherein two protection devices are formed each of which includes the first-conductivity-type layer, the buried layer, the first first-conductivity-type diffusion layer, the first second-conductivity-type diffusion layer, the second second-conductivity-type diffusion layer, and the second first-conductivity-type diffusion layer, wherein the two protection devices share at least a part of the first first-conductivity-type diffusion layer, wherein the shared part of the first first-conductivity-type high-concentration diffusion layer are coupled to the second second-conductive-type high-concentration diffusion layers of the respective two protection devices, and wherein the buried layers of the respective two protection devices are directly coupled to each other.

8. The semiconductor device according to claim 7, wherein each of the two protection device includes a third first-conductivity-type diffusion layer formed in a surface region of the corresponding one of the second second-conductivity-type diffusion layers, wherein the third first-conductivity-type diffusion layer is disposed at a location opposing the second first-conductivity-type diffusion layer via the second second-conductive-type high-concentration diffusion layer as viewed in plan view, and wherein in each of the two protection devices, the third first-conductivity-type diffusion layer, the second second-conductive-type high-concentration diffusion layer, and the second first-conductivity-type diffusion layer are coupled to each other.

9. The semiconductor device according to claim 1, wherein two protection devices are formed each of which includes the first-conductivity-type layer, the buried layer, the first first-conductivity-type diffusion layer, the first second-conductivity-type diffusion layer, the second second-conductivity-type diffusion layer, and the second first-conductivity-type diffusion layer, and wherein the buried layers of the respective two protection devices are directly coupled to each other.

* * * * *